(12) United States Patent
Lowder

(10) Patent No.: US 10,829,959 B2
(45) Date of Patent: *Nov. 10, 2020

(54) LOCKING DEVICE WITH CONFIGURABLE ELECTRICAL CONNECTOR KEY AND INTERNAL CIRCUIT BOARD FOR ELECTRONIC DOOR LOCKS

(71) Applicant: Sargent Manufacturing Company, New Haven, CT (US)

(72) Inventor: Scott B. Lowder, Orange, CT (US)

(73) Assignee: Sargent Manufacturing Company, New Haven, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/357,426

(22) Filed: Mar. 19, 2019

(65) Prior Publication Data
US 2019/0211585 A1    Jul. 11, 2019

Related U.S. Application Data

(60) Continuation of application No. 15/820,629, filed on Nov. 22, 2017, now Pat. No. 10,378,244, which is a
(Continued)

(51) Int. Cl.
*G08B 21/00* (2006.01)
*E05B 63/08* (2006.01)
(Continued)

(52) U.S. Cl.
CPC ............. *E05B 63/08* (2013.01); *E05B 9/02* (2013.01); *E05B 17/2084* (2013.01); *E05B 17/22* (2013.01); *E05B 45/06* (2013.01); *E05B 47/00* (2013.01); *E05B 47/0001* (2013.01); *E05B 55/00* (2013.01); *G07C 9/00658* (2013.01); *G07C 9/00714* (2013.01);
(Continued)

(58) Field of Classification Search
CPC ...... E05B 63/08; E05B 45/06; G07C 9/00714
USPC ......................................................... 340/542
See application file for complete search history.

(56) References Cited

U.S. PATENT DOCUMENTS 3,686,659 A    8/1972    Bostrom
4,616,491 A    10/1986    Genest
(Continued)

FOREIGN PATENT DOCUMENTS

WO    WO 99/66467 A1    12/1999

*Primary Examiner* — Mark S Rushing
(74) *Attorney, Agent, or Firm* — Wolf, Greenfield & Sacks, P.C.

(57) ABSTRACT

Locks, systems and methods of monitoring a lock, the lock having a hub with a slot rotatable by a handle to open and close a latchbolt. A locking member is moveable into and out of engagement with the hub slot to prevent and permit movement of the hub and latchbolt. A sensor on the lock, adjacent the hub and locking member, monitors a moving lock component. The sensor may sense the position of the locking member in or out of engagement with the hub slot. The sensor may be a reed switch actuated by a magnet on the moving lock component. The lock may further include a magnet mounted on the hub and the sensor may comprise a reed switch capable of being actuated by the magnet on the hub. The lock and system may include an external control unit having an alarm for controlling operation of the lock.

12 Claims, 13 Drawing Sheets

Related U.S. Application Data continuation of application No. 15/267,296, filed on Sep. 16, 2016, now Pat. No. 9,845,621, which is a division of application No. 14/622,200, filed on Feb. 13, 2015, now Pat. No. 9,617,757, which is a continuation-in-part of application No. 14/565,813, filed on Dec. 10, 2014, now Pat. No. 9,725,929, which is a division of application No. 13/600,353, filed on Aug. 31, 2012, now Pat. No. 8,922,370, which is a continuation of application No. 12/712,643, filed on Feb. 25, 2010, now Pat. No. 8,325,039, said application No. 14/622,200 is a continuation-in-part of application No. PCT/US2014/027109, filed on Mar. 14, 2014.

(60) Provisional application No. 61/791,975, filed on Mar. 15, 2013.

(51) Int. Cl.

| | | |
|---|---|---|
| *E05B 45/06* | (2006.01) | |
| *G07C 9/00* | (2020.01) | |
| *E05B 47/00* | (2006.01) | |
| *E05B 9/02* | (2006.01) | |
| *E05B 17/22* | (2006.01) | |
| *G08B 15/00* | (2006.01) | |
| *E05B 17/20* | (2006.01) | |
| *E05B 55/00* | (2006.01) | |
| *H05K 7/14* | (2006.01) | |
| *G08B 13/06* | (2006.01) | |
| *E05B 15/10* | (2006.01) | |
| *H05K 3/00* | (2006.01) | |
| *E05B 63/00* | (2006.01) | |

(52) U.S. Cl.
CPC ......... *G08B 15/005* (2013.01); *H05K 7/1418* (2013.01); *E05B 15/10* (2013.01); *E05B 47/0012* (2013.01); *E05B 63/0065* (2013.01); *E05B 2045/064* (2013.01); *E05B 2045/065* (2013.01); *E05B 2045/0665* (2013.01); *E05B 2045/0695* (2013.01); *E05B 2047/0068* (2013.01); *E05B 2047/0069* (2013.01); *E05B 2047/0073* (2013.01); *E05B 2047/0076* (2013.01); *E05B 2047/0084* (2013.01); *G08B 13/06* (2013.01); *H05K 3/0058* (2013.01); *Y10T 29/49124* (2015.01); *Y10T 29/49126* (2015.01); *Y10T 70/5155* (2015.04); *Y10T 70/7062* (2015.04); *Y10T 292/102* (2015.04); *Y10T 292/1021* (2015.04)

(56) References Cited

U.S. PATENT DOCUMENTS

| | | | |
|---|---|---|---|
| 4,633,687 A | 1/1987 | Fane | |
| 5,477,041 A | 12/1995 | Miron et al. | |
| 5,539,378 A | 7/1996 | Chang | |
| 5,626,039 A | 5/1997 | Solari et al. | |
| 5,685,182 A | 11/1997 | Chhatwal | |
| 5,868,012 A | 2/1999 | Chun-Te et al. | |
| 5,986,564 A | 11/1999 | Fraser | |
| 6,120,071 A | 9/2000 | Picard et al. | |
| 6,145,353 A | 11/2000 | Doucet | |
| 6,174,004 B1 | 11/2001 | Picard et al. | |
| 6,374,653 B1 | 4/2002 | Gokcebay et al. | |
| 6,688,063 B1 | 2/2004 | Lee et al. | |
| 6,720,861 B1 | 4/2004 | Rodenbeck et al. | |
| 6,876,293 B2 | 4/2005 | Frolov et al. | |
| 7,188,870 B2 | 3/2007 | Huang | |
| 7,273,203 B2 | 9/2007 | Carnevali | |
| 7,397,343 B1* | 7/2008 | Gokcebay | E05B 47/0611 340/5.65 |
| 7,594,603 B2* | 9/2009 | Tran | G06K 7/0008 235/380 |
| 7,690,230 B2 | 4/2010 | Gray | |
| 8,325,039 B2 | 12/2012 | Picard et al. | |
| 8,922,370 B2 | 12/2014 | Picard et al. | |
| 9,617,757 B2 | 4/2017 | Lowder | |
| 9,725,929 B2 | 8/2017 | Picard et al. | |
| 9,845,621 B2 | 12/2017 | Lowder | |
| 2002/0056300 A1 | 5/2002 | Pierre et al. | |
| 2003/0160681 A1* | 8/2003 | Menard | E05B 45/06 340/5.64 |
| 2004/0035160 A1 | 2/2004 | Meekma et al. | |
| 2005/0128050 A1 | 6/2005 | Frolov et al. | |
| 2005/0132766 A1 | 6/2005 | Milo | |
| 2005/0179267 A1 | 8/2005 | Cote et al. | |
| 2005/0212301 A1 | 9/2005 | Huang | |
| 2006/0114099 A1 | 6/2006 | Deng et al. | |
| 2008/0076014 A1 | 3/2008 | Gray | |
| 2008/0127686 A1 | 6/2008 | Hwang | |
| 2008/0209228 A1 | 8/2008 | Chandler | |
| 2008/0297367 A1 | 12/2008 | Chen | |
| 2009/0193859 A1 | 8/2009 | Kwon et al. | |
| 2009/0231132 A1* | 9/2009 | Shoenfeld | E05B 47/0012 340/542 |
| 2009/0273440 A1 | 11/2009 | Marschalek et al. | |
| 2010/0031713 A1 | 2/2010 | Brown et al. | |
| 2010/0063524 A1 | 3/2010 | McCombs | |
| 2010/0192647 A1 | 8/2010 | Gray | |
| 2011/0084799 A1* | 4/2011 | Ficko | G07C 9/00904 340/5.65 |
| 2011/0203331 A1 | 8/2011 | Picard et al. | |
| 2012/0326456 A1 | 12/2012 | Picard et al. | |
| 2013/0015974 A1 | 1/2013 | Lasker | |
| 2015/0089804 A1 | 4/2015 | Picard et al. | |
| 2016/0145904 A1 | 5/2016 | Lowder | |
| 2017/0022733 A1 | 1/2017 | Lowder | |
| 2018/0094456 A1 | 4/2018 | Lowder | |

\* cited by examiner

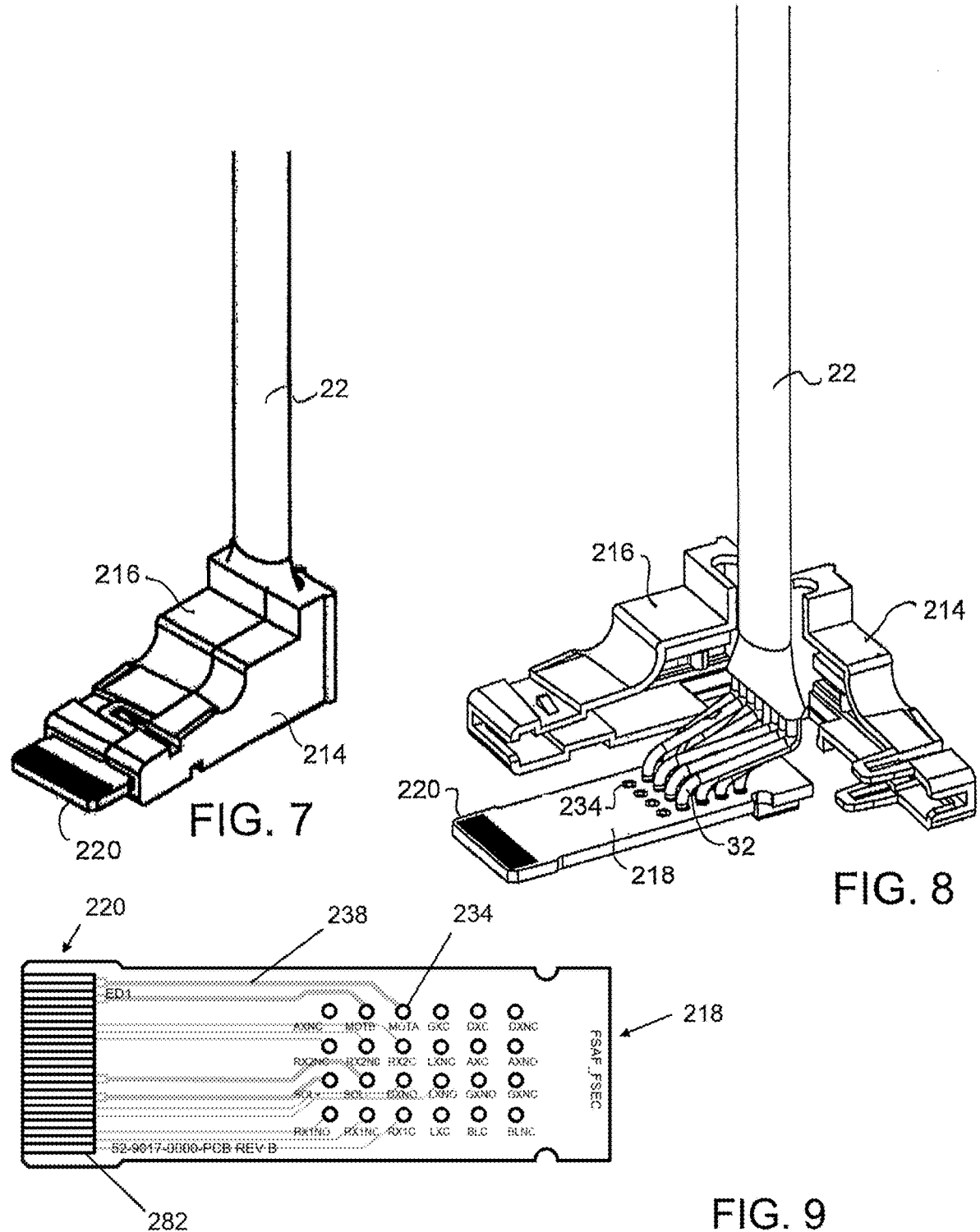

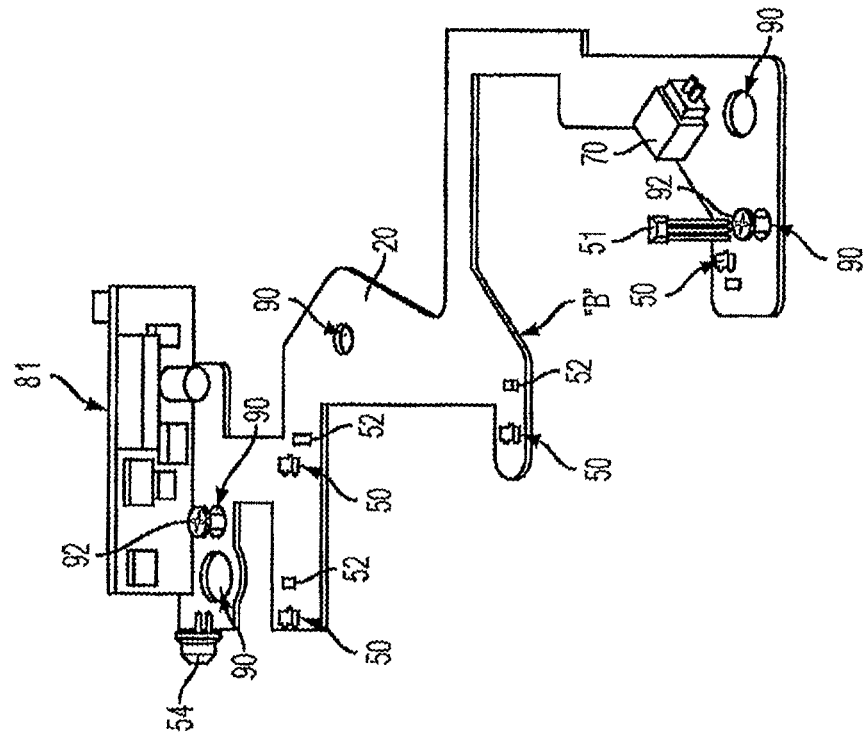
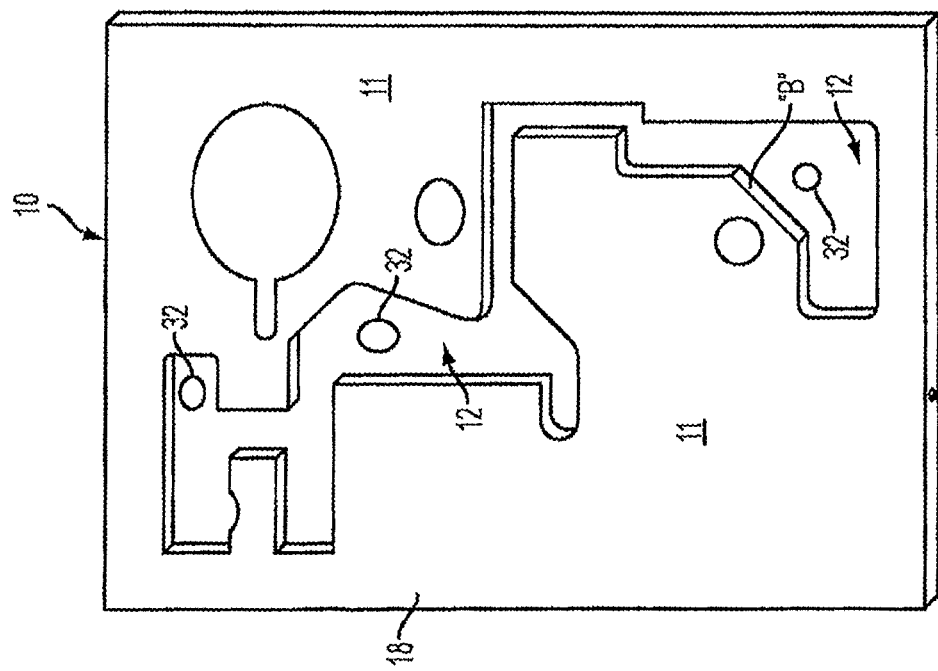
FIG. 10B
FIG. 10A

LOCKING DEVICE WITH CONFIGURABLE ELECTRICAL CONNECTOR KEY AND INTERNAL CIRCUIT BOARD FOR ELECTRONIC DOOR LOCKS

CROSS-REFERENCE TO RELATED APPLICATIONS

This application is a continuation of U.S. patent application Ser. No. 15/820,629 filed on Nov. 22, 2017, which is a continuation of U.S. patent application Ser. No. 15/267,296 filed on Sep. 16, 2016, now U.S. Pat. No. 9,845,621, which is a divisional application of U.S. patent application Ser. No. 14/622,200 filed on Feb. 13, 2015, now U.S. Pat. No. 9,617,757, which is a continuation-in-part of U.S. patent application Ser. No. 14/565,813 filed on Dec. 10, 2014, now U.S. Pat. No. 9,725,929, which is a divisional application of U.S. patent application Ser. No. 13/600,353 filed on Aug. 31, 2012, now U.S. Pat. No. 8,922,370, which is a continuation of U.S. patent application Ser. No. 12/712,643, filed on Feb. 25, 2010, now U.S. Pat. No. 8,325,039. U.S. patent application Ser. No. 14/622,200 is also a continuation-in-part of PCT Application No. PCT/US2014/027109 filed on Mar. 14, 2014, which claims the benefit of U.S. provisional patent application No. 61/791,975 filed on Mar. 15, 2013.

FIELD

The present invention relates to devices for making electrical connections to electrical components within electronic door locks. More specifically, the present invention relates to a shaped electrical connector that keys into an electronic door lock and can be configured during manufacture to carry electrical signals to and/or from selected electrical sensors, actuators and/or other components residing on a circuit board within the lock. The circuit board may reside on an surface inside the lock and/or may be embedded inside the lock to provide electrification thereto. Electrical components available for use within the door lock are selected based on the particularly selected configured electrical connector key.

BACKGROUND

Various types of access-control technology devices are available for use with, on or inside a door. For instance, it is known to use access-control technology in locking devices. Access-control technology in locking devices has increasingly shifted from traditional keying systems and mechanical articulation to digital monitoring and electronic actuation. Various electronically actuated locks and exit devices for doors exist in the art. These electronically actuated locks are generally classified into two categories, namely, those having electronic circuitry housed inside a mortised recess of a door, and those having electronic circuitry housed in an escutcheon-type lock assembly.

A variety of electronic components, such as sensors, actuators and other electronic components, may be provided in electronic door locks. The components may include actuators, such as motors, solenoids, linear drivers, and the like that operate electrically and allow the lock to be remotely locked or unlocked. The electronic door lock will also typically include one or more sensors positioned within the lock to detect and signal the position of various lock components, such as the latchbolt, the deadbolt, the locked or unlocked status of the lock, the position of the door relative to the door frame (door open or closed), and the like. The electronic door lock may also be provided with other kinds of auxiliary electronic components, such as microcontrollers and memory, and the like.

For many electronic door lock designs, the electronic components within the lock are electrically connected to an external control unit located outside the lock, such as a door lock control system, a building security system, an emergency fire control system or monitoring system, and the like. The connection from the inside of the lock to the external control unit is typically made via intricate wiring that connect through a wiring harness to the external control unit. This entails routing wiring from the external electronic circuitry, into the lock, and discretely throughout the lock in a pattern that avoids the mechanical working components of the lock. The routed wiring inside the lock is connected to switches and actuators residing therein for providing an electronically actuated and monitored lock.

Electronic door locks may include different configurations of actuators and sensors that must be provided with matching wiring harnesses to allow connection of each of the specified components—sensors, actuators, and the like—to the external control unit. Often, these configurations are individually assembled, and a matching wiring harness prepared and connected to the internal electronic lock components by hand. Problems arise in making multiple connections between the electronic door lock components and an external control unit. Such problems also encompass the connectors, the wiring harness and the selection of sensors within the lock that are to be made available to the external control unit.

The sensors may be contact switches, magnetically operated reed switches, Hall effect sensors and/or other types of sensors. Usually, such sensors are located to signal the position of mechanical components within the lock and/or the door. The sensors may be used to indicate whether the door lock is in the locked or unlocked state. They may indicate if the latchbolt is extended or retracted, or whether the door on which the lock is installed is open or closed. They may monitor the position of a deadbolt, the rotation of a handle or signal whether the lock has performed other functions.

In addition to the sensors, there may be different actuators within the electronic lock. Many different actuators exist and may include a motor, a linear driver, a solenoid, a solenoid emulator in the form of a stepping motor or stepping motor integrated into a linear actuator, and the like. The most common types of actuators are 12 volt or 24 volt solenoids that may be "fail safe" (if power is lost the door defaults to unlocked) or "fail secure" (defaults to locked).

Solenoid designs are typically intended for use with centralized building control systems where the external control unit is centrally located and is connected to multiple electronic locks with wires. The external control unit sends a simple on or off power signal to lock or unlock each electronic lock by switching it away from its default state when power is applied. When power is removed, the lock returns to its default state. In the "solenoid" type designs, actual solenoids may be used or solenoid emulation may be used in which a motor, linear driver, or other actuator responds to the same type of simple "on power" vs. "off power" control signal.

Motorized electronic lock designs are most commonly used with an external control unit mounted on or immediately adjacent to the door. Typical applications for this type of low power motor actuator electronic lock include hotels, secure buildings, and the like where a card key reader, secure proximity detector, keypad, biometric (fingerprint, iris scan, voice recognition, and the like) is located in the external control unit. The external control unit may be located in one or more additional housings mounted on the door, and may also include batteries to provide power through wired connections to the electronic lock. Wires extend from the sensors in the lock to the external control unit to provide information to the external control unit about the status of the lock. Wires may also carry control signals from the external control unit to actuators in the electronic lock to lock or unlock the door in response to the presentation of security credentials.

Various other electronic door lock designs exist, each provided with a wide variety of available actuators and sensors to meet various needs. Regardless of whether the external control unit is mounted in close proximity to the lock, wiring for all of these different components actuators and sensors must exit the lock housing as is common for motorized and battery powered locks or in a more distant central location as is typical for solenoid locks. The numerous possible variations in lock configuration results in many different wiring harnesses and typically requires each of the sensors to be manually installed and connected. This is labor intensive and expensive as well as making it difficult to keep the many variations in stock for rapid delivery to customers.

Due to constrained real estate in a majority of currently available locks, it has also become difficult and burdensome to provide the necessary wiring into and throughout the lock for the electrical connection between the switches, sensors and actuators in the lock and the electronic circuitry external to the lock. Concerns are also raised when too much electrical wiring resides external to the locking device. Insulated wire harnesses routed through a lockbody are subject to damage from contact with mechanical components.

It is also undesirably burdensome, time consuming, expensive and expends valuable real estate within the lock by requiring the lock casing to be fabricated with a number of holes and slots for accommodating the inserted wiring, as well as to be fabricated with brackets or harnesses inside the lock for securing and positioning the wiring accommodated therein. As such, these conventional mortised recess and escutcheon-type lock assemblies suffer from fabrication difficulties as well as performance limitations in providing accurate wire routing to switches, actuators, and wire harnesses within existing mechanical lock mechanisms having constrained real estate.

In view of the above, there is a need for improved wiring harness and connection systems that reduce the manual interconnection and wiring required for electronic locks having different sensors and actuators. Needs also exist for these improved wiring harness and connection systems to allow digital monitoring and electronic actuation to be implemented in current locking devices that have constrained real estate. This constrained real estate may be due to more compact designs, or even those existing mechanical lock mechanisms having increased and/or improved technological advances residing inside the lock that consume an increased and/or substantial portion of the valuable real estate therein.

SUMMARY

In some embodiments, an electronic lock system includes a lock. The lock has a predetermined plurality of functions, as well as a predetermined plurality of sensors and actuators configured to enable the predetermined plurality of functions. The lock system also includes an interchangeable electrical connector selected from a plurality of differently configured interchangeable electrical connectors. Each interchangeable electrical connector is connectable to the lock and each is configured to enable a different subset of the predetermined plurality of functions of the lock.

In some embodiment, a method of upgrading a lock includes providing a lock, the lock having a predetermined plurality of functions, and a predetermined plurality of sensors and actuators configured to enable the predetermined plurality of functions. The method includes selecting one of a plurality of interchangeable electrical connectors, each interchangeable electrical connector being connectable to the lock and differently configured to enable a subset of the predetermined plurality of functions of the lock. The method includes connecting the selected interchangeable electrical connector to the lock thereby enabling the subset of the predetermined plurality of functions of the lock.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings:

FIG. 7 is a perspective view of the electrical connector key of the present invention. Wires exiting the electrical connector key may be connected directly to the external control unit or may be attached to an intervening electrical connector.

FIG. 8 is an exploded perspective view of the electrical connector key in FIG. 7.

FIG. 9 is a plan view showing the configurable circuit mounted within the connector key housing. Different circuit boards may be used to achieve different desired connections or wires may be selectively connected to enable desired interconnections.

FIG. 10A is a top elevational view of a locking device housing side having a recessed opening therein for receiving a printed circuit board (PCB) in accordance with one or more embodiments of the invention.

FIG. 10B is a top elevational view of a PCB of the invention having a configuration that is selected to avoid interference with any mechanical working components within a mechanical locking device. A variety of electrical components are surface mounted to the PCB so that the backside of the PCB remains substantially planar.

DETAILED DESCRIPTION

In describing the embodiments of the present invention, reference will be made herein to FIGS. 1-12C of the drawings in which like numerals refer to like features of the invention.

In one or more embodiments, the invention integrates electronic circuitry within existing and future locking devices. The locking devices suitable for use include those housed either entirely or partially within a housing, wherein one or more electronic circuit boards may be embedded in accordance with the various embodiments of the invention. These locking devices include, but are not limited to, a mortise lock, a bored lock, a cylindrical lock, an electric strike, a tubular lock, an auxiliary lock, and a deadbolt and the like. The "electronic lock" as referred to herein contains one or more mechanical locking components which may be a latchbolt, a dead bolt, a guard bolt, handles for retracting the latchbolt (or lock components connected to such handles), knobs or levers for extending/retracting the deadbolt, buttons or turn knobs for manually locking/unlocking the electronic lock, key cylinders and the like.

The present invention is designed for lock devices, such as mortise locks, that incorporate multiple electronic components, such as magnetic sensors to sense the positions of moving components in the lock, such as the latch bolt, the deadbolt and the like. In an exemplary application for this invention, a mechanical lock is electrified by adding small magnets to moving mechanical components within the lock and by adding magnetically operated reed switches or Hall effect sensors to a primary circuit board mounted within a recess in the mortise lock cover. The sensors may be mounted to the primary circuit board such that they protrude into close proximity with the corresponding magnet for the component being monitored when the mortise lock cover is installed. The primary circuit board may connect to one or more secondary circuit boards, such as controller boards for motors or solenoids or solenoid emulating drive systems, and the like.

Figure 1:
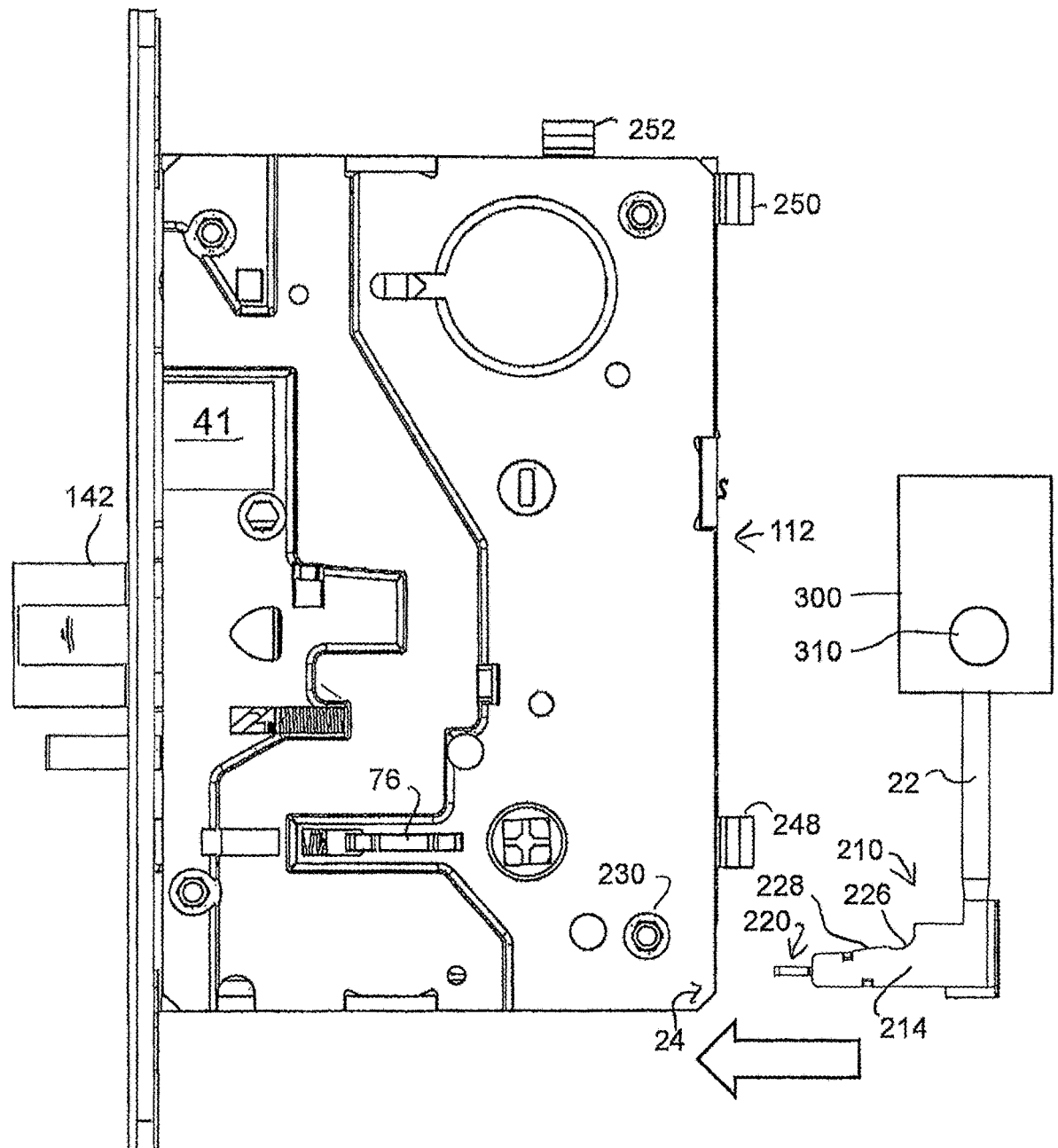
FIG. 1 is a left side elevational view of the electrical connector key of the present invention ready for connection to a mortise lock in the direction of the arrow.

Referring to FIG. 1, an electrical connector key 210 according to the present invention is provided to make connection to selected electrical components mounted within an electronic door lock 112, which in one or more embodiments is a mortise lock 112 having a retractable deadbolt 41. The electrical connector key 210 includes a connector key housing shaped to engage the electronic door lock 112. The connector key housing may be formed in two halves 214, 216 (see FIG. 7) that surround a configurable circuit 218. In the embodiment shown, one end of the configurable circuit 218 is a card edge connector forming a lock side key connector 220. Within the connector key housing 214, 216, the configurable circuit 218 makes connection between connection points along the card edge connector and wires forming cable 22. Cable 22 leads to the external control unit 300, which sends and/or receives signals passing between electrical components in the electronic door lock 112 and the external control unit.

Figure 2:
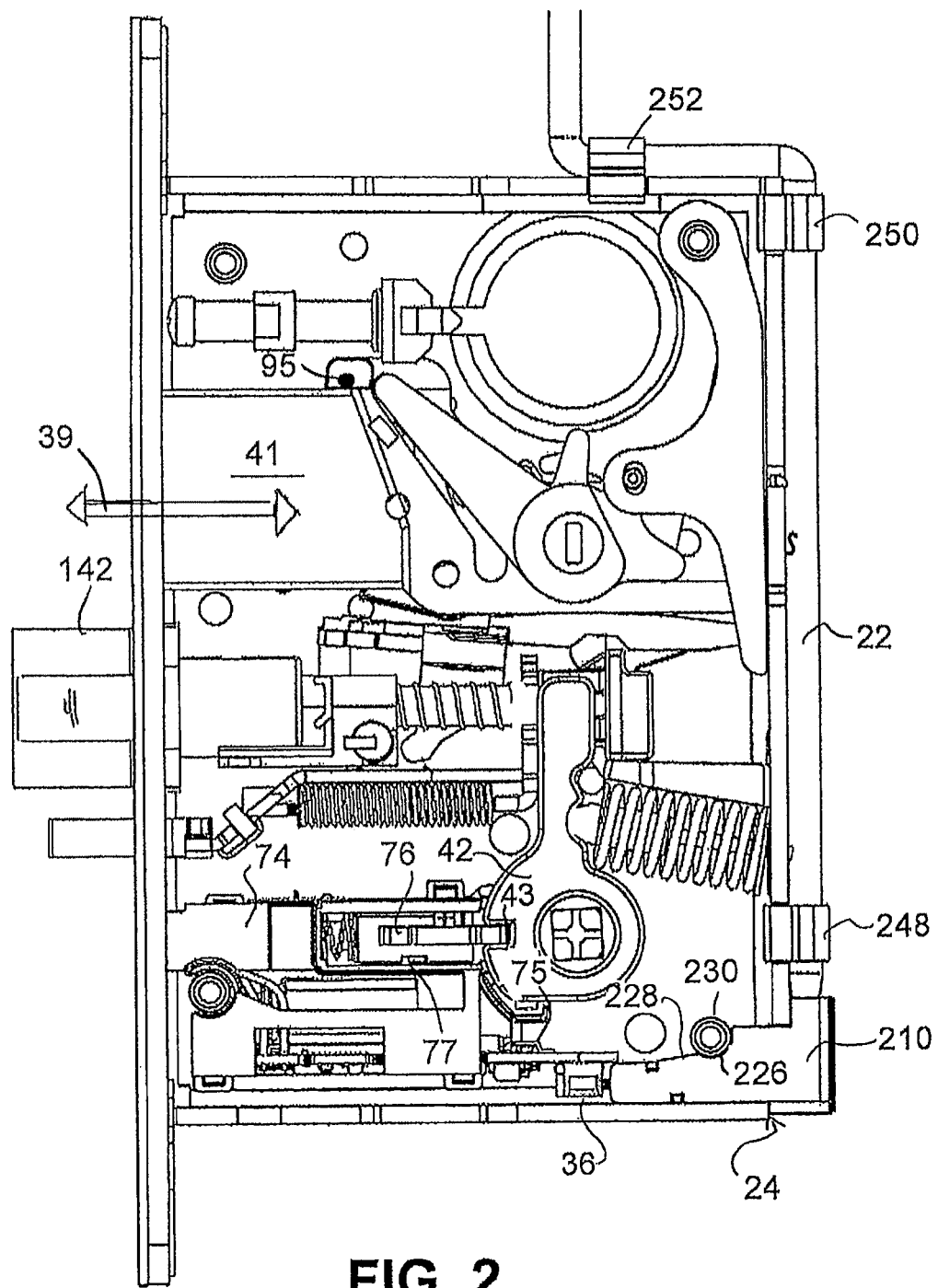
FIG. 2 is a left side elevational view of the electrical connector key of the present invention inserted into the mortise lock shown in FIG. 1. The cover plate of the mortise lock has been removed to show internal lock components, sensors and actuators and to better show how the electrical connector key of the present invention engages the mortise lock.

FIG. 2 shows the electrical connector key 210 inserted into a corresponding opening 24 in the lower right corner of the mortise lock 112. The connector key housing 214, 216 is provided with a notch or groove 226 and a ramp surface 228. As the electrical connector key 210 is inserted into opening 24, the ramp surface 228 contacts and slides under a stud 230 in the interior of the mortise lock 112. The electrical connector key 210 snaps into a desired position as the groove 226 reaches the stud 230. Also, as the electrical connector key 210 is inserted, the card edge connector forming lock side key connector 220 engages lock connector 36. This connects the circuit board 218 of the connector key 210 to electrical components within the mortise lock 112. By configuring the electrical connections provided on the configurable circuit board 218, different wires within cable 22 may be connected or not connected.

Referring to FIGS. 7-9, configuration of the key may be achieved simply by connecting or not connecting wires 32 in cable 22 to corresponding solder points 234 on key circuit board 218. Alternatively, circuit board traces 238 on the key circuit board 218 may be omitted or added to achieve configuration. Further, the key circuit board 218 may be provided with various cross connections, or with additional electrical components to achieve configuration.

Additional electronic components may be mounted on the key circuit board 218 to identify to circuitry in the lock and or the external control unit 300 what type of electrical connector key has been installed and or to signal that a valid and authorized electrical connector key has been installed. Such additional components may be as simple as one or more resistors providing a resistance that may be detected by electronic circuitry in the lock (and/or the external control unit) or as complex as an identification chip that provides encrypted communication with the lock to identify that an authorized electrical connector key has been installed.

It will be understood from the above description that the electrical connector key described permits a single lock mechanism 112, having multiple sensors and/or actuators to be prepared in advance and to subsequently be modified to supply different functions simply by inserting a different electrical connector key 210 into the opening 24 in the lock 112. For example, the lock 112 may be provided with many more sensors than are typically ordered by a customer. One customer may desire no sensors on the lock and may only require a basic 12 volt fail-safe type solenoid lock. In such a lock, when 12 volt power applied is to a wire pair in cable 22, the lock will enter the locked state. When power is removed from that wire pair, the lock will revert to its default open and unlocked state. This can be achieved by not connecting any sensor wires 32 through the configurable circuit 218.

A second customer may specify a similar 12 volt fail-safe type solenoid lock except that the lock must monitor and signal the status of the maximum number of components within the lock. Components to be monitored will include the position of the latchbolt 142 (see FIGS. 1, 2 and 5), the locked or unlocked state of the lock mechanism, and the like. This can be achieved by connecting all wires within cable 22 to corresponding connection points on the configurable circuit 218. The second customer is provided with a lock mechanism 112 that is identical in all respects to the lock provided to the first customer. Only the electrical connector key 210 provided to the second customer will be different.

It will be understood that the first customer will be provided with a lock mechanism having more sensors than necessary to provide the functions ordered. This increases the cost of the lock provided. However, that cost is offset by the reduction in the number of different locks necessary to be stored in inventory and by the advantages derived by rapidly shipping each customer's order due to avoiding the time and cost of custom building each different order. Other advantages lie in the decreased cost of each lock due to the increase in the number of identical locks manufactured. The construction of the locks may be more easily automated. Yet another advantage is derived from the fact that the lock mechanism provided to the first customer (without monitoring capability) may be upgraded in the field to a more sophisticated lock mechanism simply by removing the electrical connector key 210 initially provided and replacing it with an electrical connector key having greater monitoring capability.

In some implementations of the system described above, it may be desirable for the lock manufacturer to prepare a limited number of standard lock mechanisms of increasing complexity instead of supplying a single identical lock design to all customers with all possible sensors installed. This reduces the cost of providing the least commonly needed sensors to all customers, when there is little likelihood that such sensors will ever be used or activated by purchasing a correspondingly configured electrical connector key. Although this requires storing more than one type of lock in inventory, it still allows a reduction in inventory and manufacturing costs as compared to holding in inventory all possible configurations for the lock. Only a small subset of locks must be manufactured—for example, a low end model having the most commonly ordered sensors, a high end model having all or almost all available sensors and one or more intermediate models having some, but not all available sensors. The least complex and least expensive lock mechanism 112 can be selected from among the limited subset of standard locks, provided the selected lock includes all the monitoring and/or control) functions ordered by a customer. The configured electrical connector key 210 having only the ordered features will be provided with the selected lock, and total cost is reduced while still meeting the customer's needs.

In view of the modular design shown here, it is also possible to store only a limited subset of circuit boards containing various combinations of sensors and to quickly install the appropriate circuit board having all sensors required, and to match the same with an appropriately configured electrical connector key 210 that activates only those sensors actually ordered by the customer. In an exemplary design, the electrical connector key 210 will be configured at the factory to provide all the different available combinations of functions that may be ordered. The housing 214, 216 may be permanently glued together or formed as a single molded housing. Only the less expensive, differently configured, electrical connector keys need to be stored in inventory to provide all the myriad of combinations of functions that are offered to the public.

Just prior to shipment of a lock ordered with a specified combination of functions, the appropriately configured electrical connector key 210 is selected and installed in the lock 112. The key 210 is inserted into opening 24 in the lock. The key snaps into place engaging stud 230 in groove 226 of the key. As the key is inserted, the card edge connector 220 at one end of the configurable circuit 218 (see FIG. 7) engages the lock connector 36 in the lock 112 (see FIG. 2) and connects the wires 32 in connector cable 22 to the electronic circuitry board 20 (see FIG. 3) and 20' (see FIG. 4) within the lock. This enables the specified monitoring and/or control functions. The cable 22 is then clipped into cable clips 248, 250 and 252 along the back of the lock 112.

The card edge connector 220 forming the lock side key connector includes multiple electrical connection points in the form of an array of spaced lands 282 contacted by corresponding connection points in the lock connector 36. The cable clips 248, 250 and 252 ensure that the cable 22 is held within the mortise provided for the mortise lock 112. The connector key 210 is also shaped so that when the connector key 210 is installed, the key does not project beyond the space provided in the mortise for the mortise lock 112. The end of the cable 22 has not been shown, but may be provided with a connector suitable for connection to the external control unit receiving sensor signals and or sending control signals to the actuator circuit 20' to lock or unlock the lock 112. Alternatively, the wires within cable 22 may be directly soldered to the external control unit.

Figure 3:
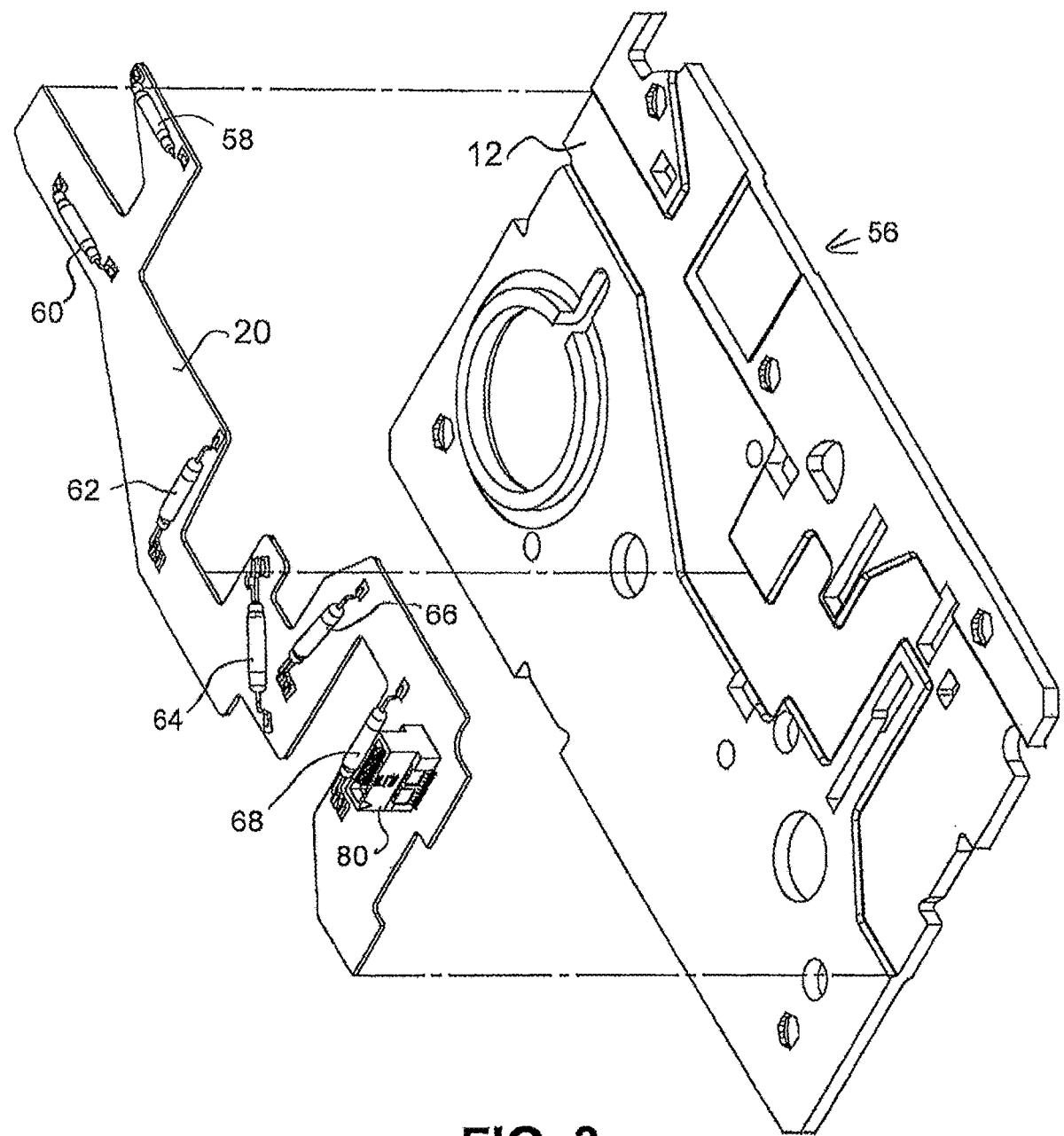
FIG. 3 is a perspective exploded view showing the mortise lock cover plate omitted from FIG. 2 and an example circuit board carrying sensors for electrical connection through the electrical connector key of the present invention.

Referring to FIG. 3, an example of construction for the circuitry within the mortise lock is shown. The circuitry shown may be a circuit board residing inside the mortise lock and configured to avoid working components of the lock, and may be an embedded circuit board 20 that fits within a corresponding recess 12 formed in the cover plate 56 for the mortise lock 112. A design for such an embedded circuit board 20 is more fully disclosed in U.S. Pat. No. 8,325,039, the disclosure of which is incorporated herein by reference in its entirety, and described further below in reference to FIGS. 10A-12C.

By embedding the circuit board in the cover plate 56, electrical connections can extend throughout the mortise lock without interfering with the mechanical components therein. Embedded circuit board 20 is provided with multiple sensors 58, 60, 62, 64, 66 and 68. In the embodiment shown, these sensors are reed switches that are actuated when a permanent magnet mounted within a nearby moving mechanical lock components moves towards and away from the sensor. Although reed switch sensors are shown, other sensors, such as mechanical switches, Hall effect sensors and the like may also be used. Each moving lock component to be monitored is provided with a magnet to actuate the associated magnetic reed switch sensor monitoring that component. For example, magnet 75 (see FIG. 2) is mounted on spindle hub 42 and moves whenever an associated handle is rotated to retract the latchbolt 142.

Figure 4:
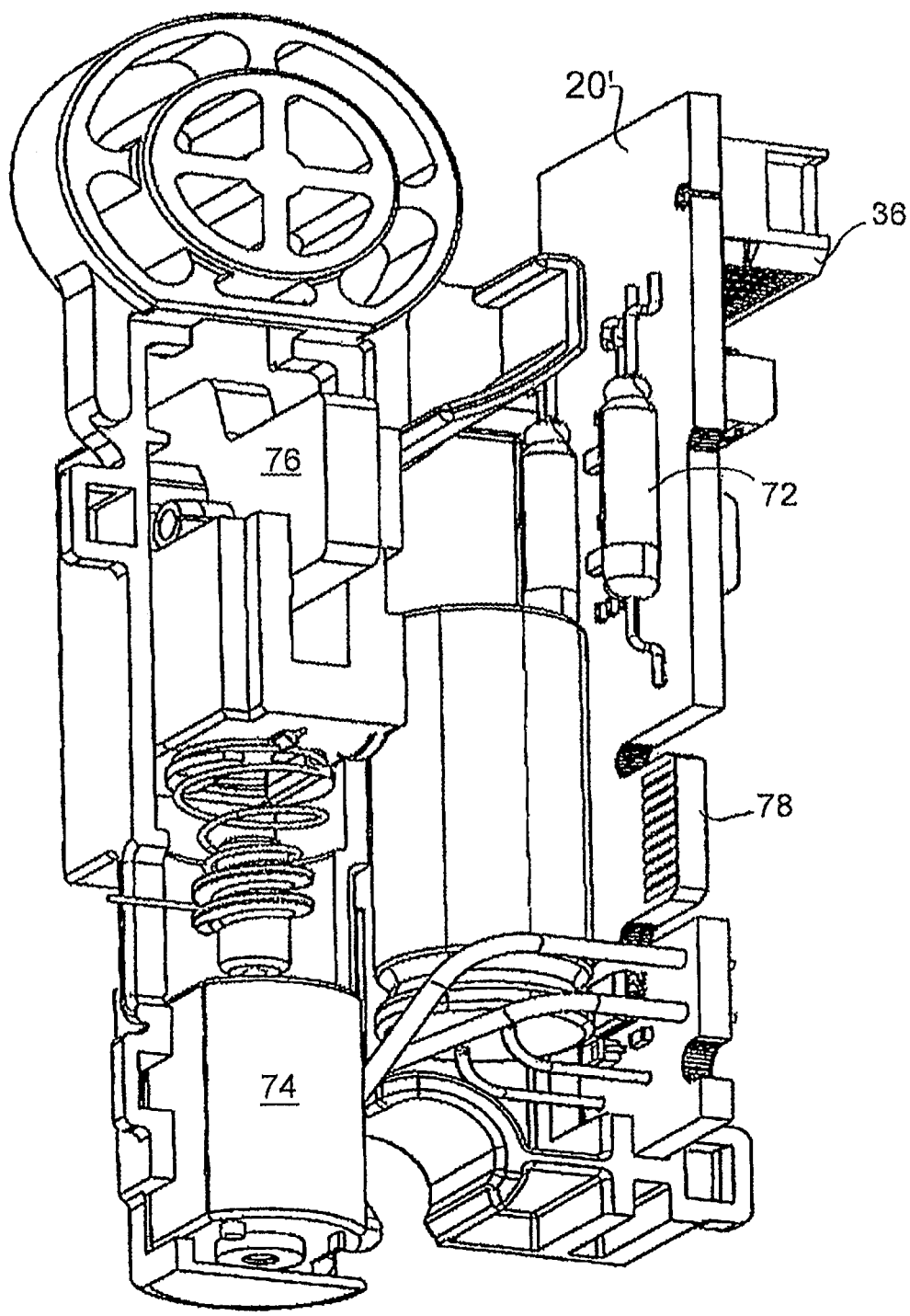
FIG. 4 is a perspective view of a motor actuator for the mortise lock in FIG. 2, which may also be connected through the electrical connector key of the present invention. Additional sensors are also seen on the circuitry associated with the motor actuator. The motor actuator shown may simulate the operation of a solenoid actuator.
Figure 5:
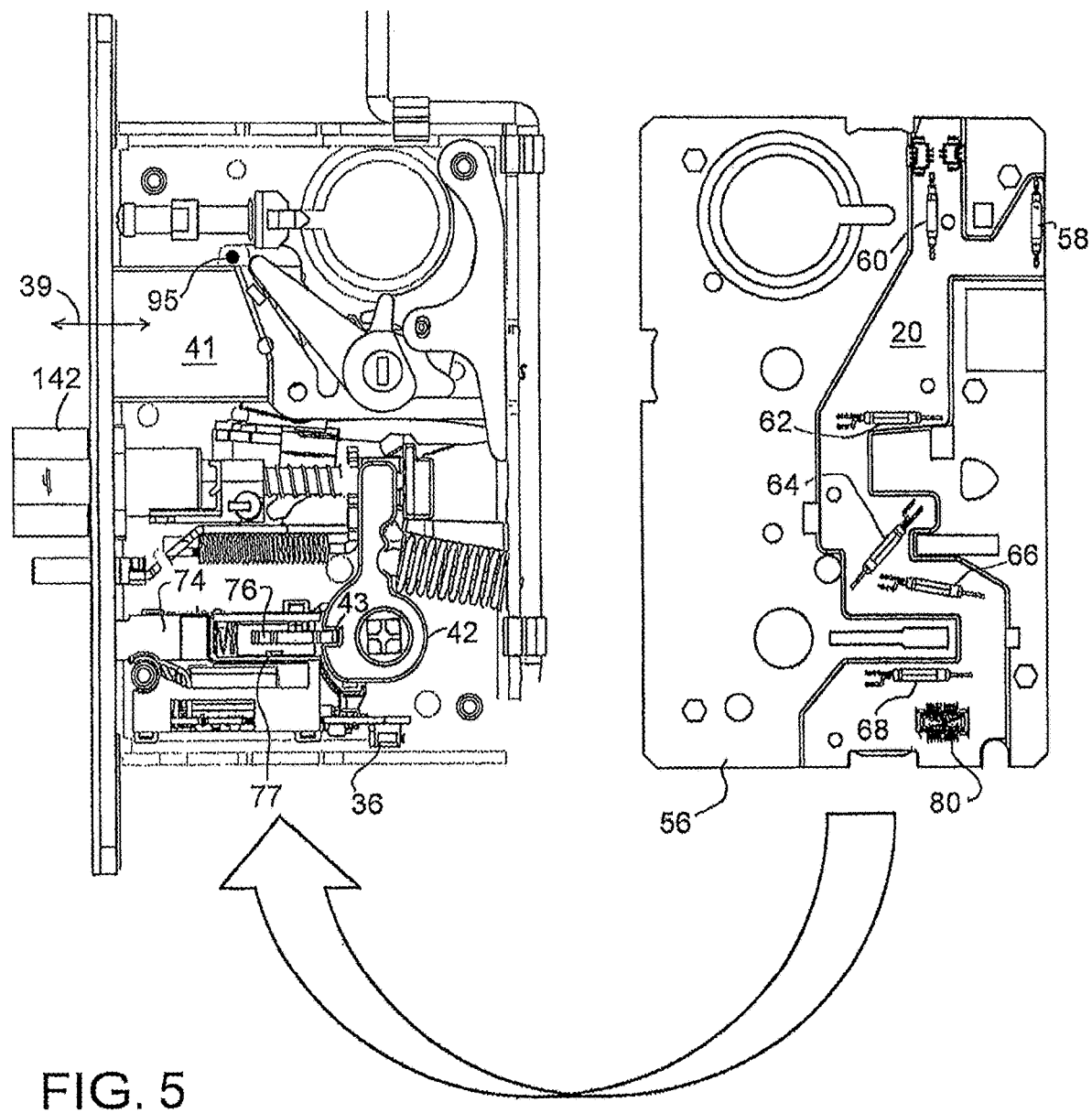
FIG. 5 is a side elevational view showing the mortise lock in FIG. 2 with the cover plate of FIG. 3. The cover plate is ready for assembly to the mortise lock in the direction of the arrow to position the sensors mounted to the circuit board of the cover plate in proper relation to the components in the mortise lock.

As may be seen in FIG. 5, sensors 58 and 60 are single throw magnetic reed switch sensors and have only two electrical switch connections, while sensors 62, 64, 66 and 68 are double throw switch sensors and have three electrical switch connections. Additional sensors may be provided, such as sensor 72 mounted on actuator circuit board 20' (see FIG. 4). In the embodiment shown, the lock side key connector 220 is a card edge connector that engages connector 36 mounted on circuit board 20 for the actuator. The actuator includes control circuitry and a motor 74 that drives a locking piece 76 to lock and unlock the lock mechanism 112. The actuator circuit board 20 includes a connector 78, which may be a card edge connector, engages connector 80 on embedded circuit board 20 when the cover plate 56 is installed. In this way, the two circuit boards 20, 20' are connected to each other and the connector 36 is positioned to receive the lock side key connector 220 when the electrical connector key 210 is inserted into the lock 112. The sensors may be of any desired type and may be mounted on either of the disclosed circuit boards or on additional circuit boards within the lock mechanism.

Referring to FIG. 5, the lock and method determine if the hub to be turned by the door handle is actually locked or unlocked, as measured by a sensor adjacent the hub and monitored by the control unit. In the example of the mortise lock, this determines if tampering has occurred to disengage the locking member from the hub slot. In the embodiment shown in FIG. 5, sensor 68 is used to monitor locking piece 76, which translates in and out of engagement with a slot 43 in spindle hub 42 to lock and unlock the lock mechanism 112. Locking piece 76 is translated by an actuator assembly including a solenoid or motor, such as motor 74, upon receiving a signal from a control unit 300 in an external device. The control unit may be a remote access control panel or the controller of an integrated locking device. As shown in FIG. 5, when the mortise lock cover plate 56 is installed, sensor 68 protrudes into close proximity with magnet 77 below locking piece 76. When locking piece 76 is translated to block the rotation of spindle hub 42 (lock is secured), magnet 77 activates sensor 68. Conversely, when locking piece 76 is translated to permit spindle hub 42 to rotate (lock is unsecured), sensor 68 is not activated.

Figure 12A:
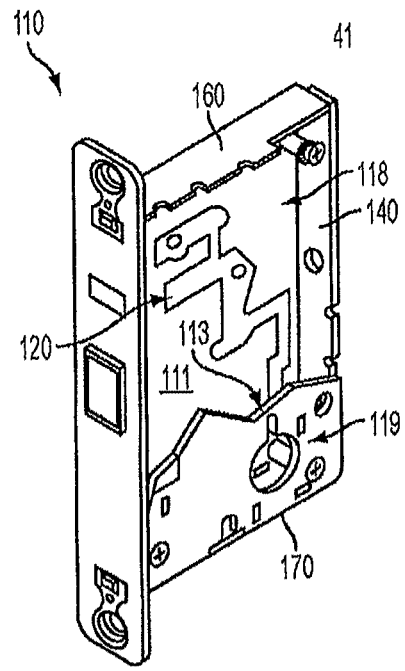
FIGS. 12A-C show side elevational views of one or more embodiments of the invention whereby one or more PCBs of the invention are embedded directly inside a mortise lock housing to convert a mechanical mortise lock into an electrified mortise lock having capabilities for digital monitoring and electronic actuation.
Figure 12B:
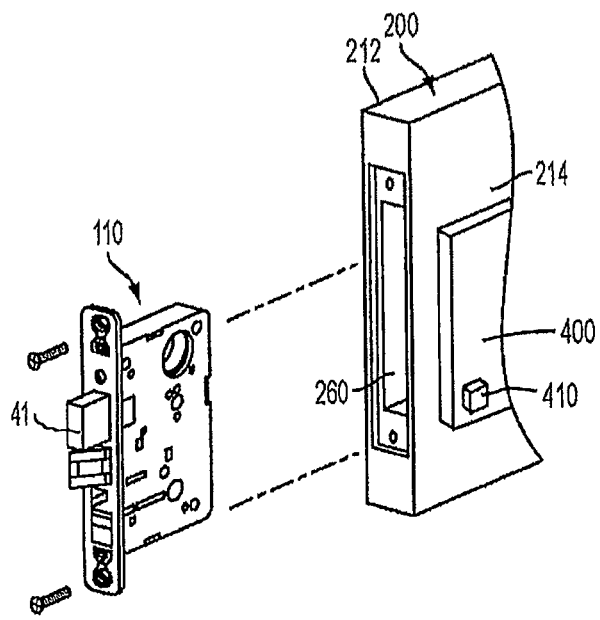

Sensor 68 may be a form-C double throw magnetic reed switch sensor with three electrical contacts. Sensor 68's output state may be configured per design requirements to show a "normally open" or "normally closed" state and the output state will only change due to the translation of locking piece 76 as a result of a signal sent from an external control unit. Accordingly, sensor 68's output may be monitored by external control unit 300 which can directly detect an attempt to tamper with the lock assembly by manually and/or mechanically translating locking piece 76 to gain entry, thereby triggering an external alarm 310 in the control unit. In normal operation, external control unit 300 sends a signal to activate the solenoid or motor to translate locking piece 76. If the control unit 300 has not sent a signal to activate the solenoid or motor, a change in output state of sensor 68 will trigger an external alarm indicating that tampering has occurred. Additionally, the circuit containing sensor 68 may be connected in series with a sensor detecting the presence of electrical connector key 210 in the lock assembly. The sensor detecting the presence of connector key 210 may be integrated within external control unit 300, or integrated within the lock assembly 112 or connector key 210 itself. If electrical connector key 210 is removed from the lock assembly, the control unit 300 will detect a change in output state from the electrical connector key sensor and/or sensor 68, again triggering an external alarm. This tamper-detection circuitry may be designed in series with other sensors/switches, such as a sensor 410 that detects the removal of a covering trim component, integrated reader, keypad, escutcheon or other external lock member 400, as shown in FIG. 12B, in accordance with the object of the present invention.

Figure 6A:
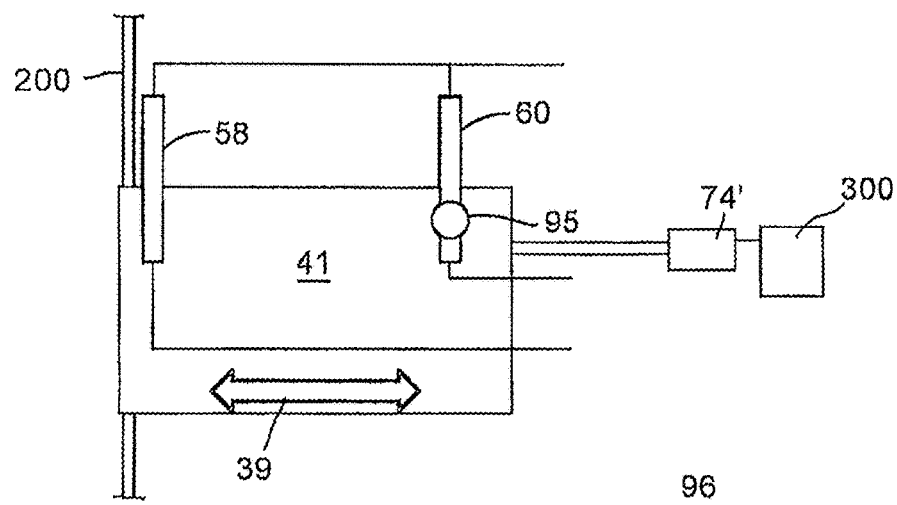
FIG. 6A-C show secure and unsecure states of the deadbolt monitored by magnet position in relation to positioning of two sensors.
Figure 6B:
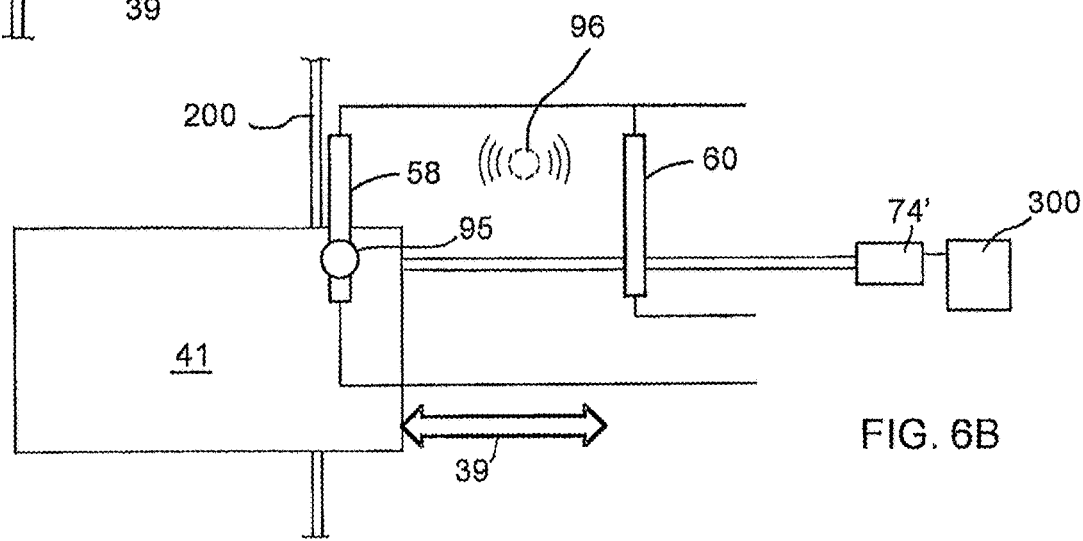
Figure 6C:
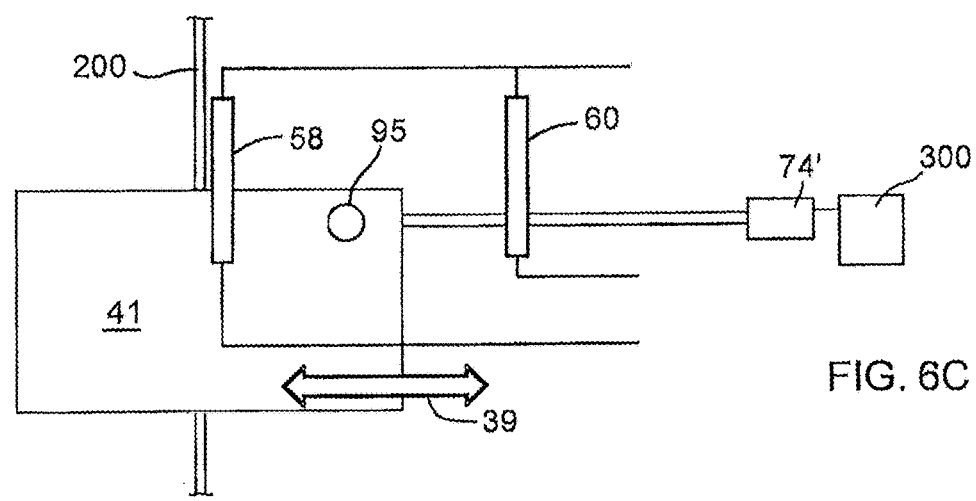

The present invention also provides a lock and method to detect tampering with the latchbolt or deadbolt locking mechanism. As further shown in FIG. 5, each of sensors 58 and 60 may be a form-A single throw magnetic reed switch sensor sharing a common input, and are jointly used to monitor deadbolt 41. As shown in FIGS. 6A-6C, deadbolt 41 may be translated back and forth in direction 39 by an actuator assembly including a solenoid or motor 74', upon receiving a signal from an external control unit 300. Alternatively, deadbolt 41 may be mechanically actuated, such as by the rotation of a key, rotation of a thumb turn, or through linkage driven by the latchbolt. It is desirable to have the ability to detect both a projected (secured) and retracted (unsecured) deadbolt position for maximum tamper prevention. As may be seen in FIG. 5, when the mortise lock cover plate 56 is installed, sensors 58, 60 protrude into close proximity with magnet 95 which is mounted on deadbolt 41. As shown in FIGS. 6A-6B, sensors 58, 60 swap output states as the deadbolt is projected or retracted. As depicted in FIG. 6A, when deadbolt 41 is retracted (unsecure), magnet 95 activates sensor 60 and sensor 58 is not activated. Conversely, when deadbolt 41 is projected (secure), magnet 95 activates sensor 58 and sensor 60 is not activated, as shown in FIG. 6B.

The output state of sensors 58, 60 may be configured per design requirements to show a "normally open" or "normally closed" state, and the output of sensor 58, 60 may be simultaneously monitored by external control unit 300 which can detect an attempt to tamper with the lock assembly by manually and/or mechanically translate deadbolt 41 to gain entry. If the external control unit 300 has not previously sent a command signal to activate the solenoid or motor 74' to translate deadbolt 41 into a retracted (unsecured) position, the external control unit will sense a change in output state of either sensor 58, 60 and will trigger an external alarm 310 indicating that tampering has occurred.

Moreover, it is understood that under normal operation, magnet 95 can only be present at one sensor or the other (deadbolt projected or retracted). Tampering may be attempted by applying a magnetic field on the exterior of the lock. Therefore, if both sensors 58, 60 activate in the presence of a magnetic field, it is an indication that a magnetic field is being applied from an external source, such as magnet 96, as shown in FIG. 6B. In such a scenario, by monitoring the outputs of sensors 58, 60 simultaneously, a magnetic tamper can again be detected by external control unit 300, triggering an alarm.

The deadbolt monitoring system may also detect a deadbolt position somewhere in between a projected (secured) and retracted (unsecured) position, which may also indicate tampering. As shown in FIG. 6C, when deadbolt 41 is between these positions, magnet 95 is not present at either sensor 58 or sensor 60 and neither sensor is activated, and there is the simultaneous absence of a signal from both. If this condition persists for a predetermined period of time as monitored by external control unit 300, as set per design requirements, an external alarm will be triggered which signals to the user that a potential vulnerability exists in the lock assembly 112.

FIGS. 10A-F show those embodiments of the invention included an embedded circuit board 20. In these embodiments, at least one interior surface 11, 13 of a locking device housing 10 is provided with a channel 12 that corresponds to the shape, size and thickness of a corresponding printed circuit board (PCB) 20. In one or more embodiments, this channel 12 is a recessed channel residing within a thickness of a housing side. The interior surfaces of the locking device housing 10 may include any interior surface within the housing 10 including, but not limited to, a first interior surface 11 of a first side 18 of the housing, a second interior surface 13 of a second side 19 of the housing, and so on. At least two or more of these interior surfaces of their respective sides may oppose one another, e.g., interior surface 11 of side 18 opposes interior surface 13 of side 19, with the mechanical working components of the lock residing therebetween.

Both the recessed channel 12 and the PCB 20 have corresponding shapes and sizes configured so that they avoid interference with mechanical working components of the locking device. Mechanical working components include latch bolts, dead bolts, cylinder locking mechanisms, blocking mechanisms, hubs, cams, levers, and the like. These shapes and sizes of the recessed channel 12 and PCB 20 also avoid interference with any openings in the housing 10 including, but not limited to, lock cylinder openings, screw or bolt openings, spindle openings, threaded openings, blocking openings, and the like.

In one or more embodiments, the first 18 or second 19 sides alone may be provided with a PCB 20 (either embedded therein or residing on a surface thereof), or both the first and second sides 18, 19 of the locking device housing 10 each may be provided with one or more PCBs 20 in accordance with the invention. Multiple embedded PCBs 20a, 20b, 20c may be provided in or on the PCB. Alternatively, a single continuous circuit board embedded within or residing on an interior surface of one or more of the sides of the locking device housing 10, as shown in FIGS. 10A-F. The single continuous PCB is configured with a shape and thickness that does not interfere with any working or moving components inside the mechanical lock. For instance, referring to the drawings, the PCB may have a shape that carries electrical wiring on the circuit board between the top 16 and bottom 17 of the lock and simultaneously between the left and right lateral sides 18, 19 of the lock. In one or more embodiments this shape may be a sinusoidal shape that covers over a distance of more than 50%, and even more than 60%, of the diagonal distance across the surface area of the side in which such sinusoidal shaped embedded PCB resides.

The PCBs 20 provide electrical wiring connections between the multiple circuit boards from top 16 to bottom 17 and left to right lateral sides 18, 19 of the lock. The circuit boards residing on or embedded within these multiple interior surfaces may be electrically connected to one another via wiring extending from one side of the housing 10 to the other side of the housing 10. This wiring may reside inside the locking device housing 10 (e.g., it may be contained within another circuit board), or it may reside outside the locking device housing and electrically connect the PCBs to one another through the openings 30 residing at the bottom of the recessed channels 12.

Figure 10D:
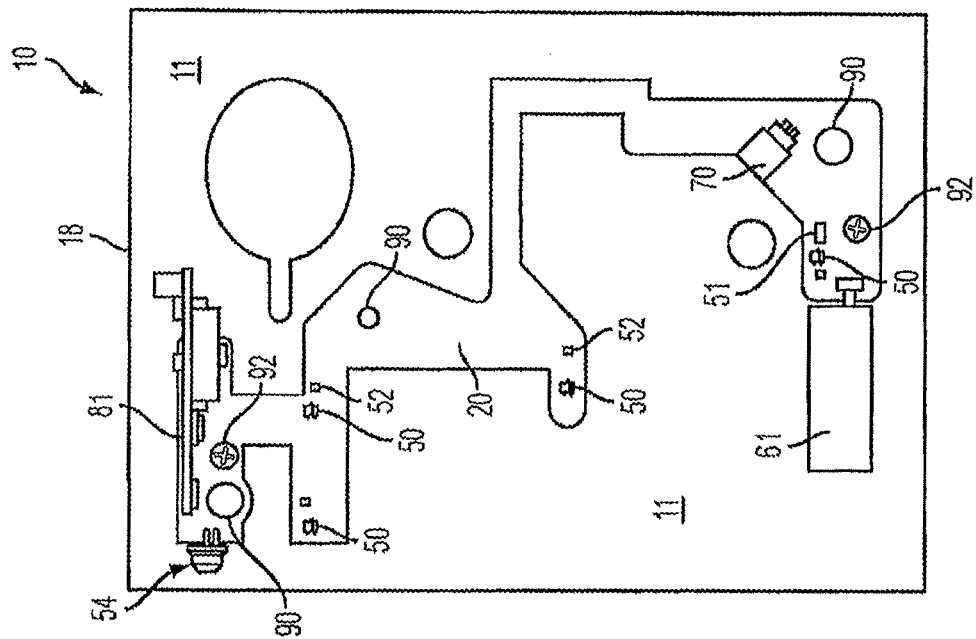
FIG. 10D is a top plane view showing the PCB of FIG. 10C embedded into the recessed opening in the housing side.
Figure 10C:
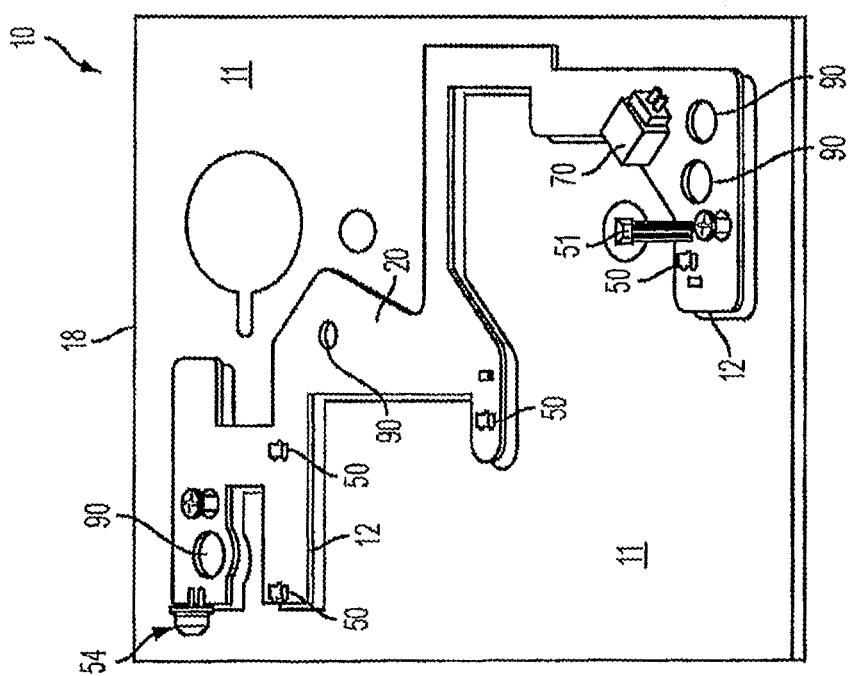
FIG. 10C is a top elevational view showing the PCB of FIG. 10B positioned over the recessed opening in the housing side of FIG. 10A.
Figure 10F:
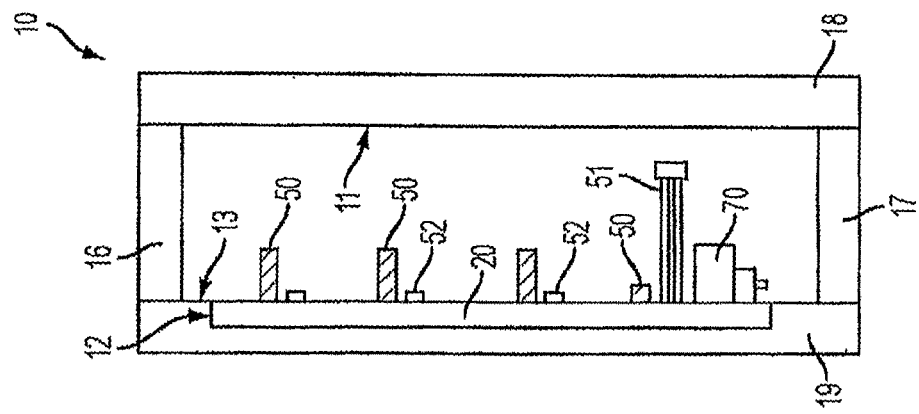
FIG. 10F is another side view showing a single PCB module in accordance with one or more embodiments of the invention embedded into lateral side of a locking device housing, whereby the PCB may have electronic components adjacent the surface of the PCB and/or electronic components that extend into the locking device to detect motion and multiple positions of the working components of such lock.
Figure 10E:
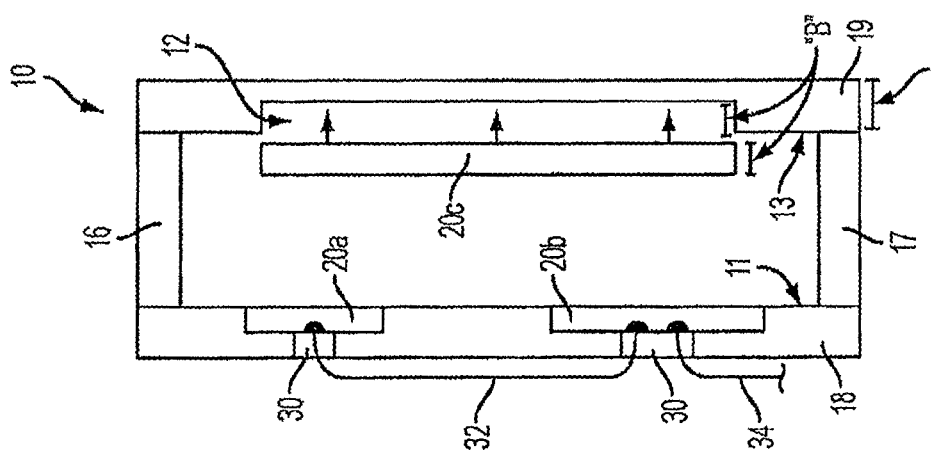
FIG. 10E is a side view showing one or more PCBs of the invention embedded within one or more lateral sidewalls of a locking device housing, with the embedded PCBs being in electrical communication with one another. As shown, each PCB has a thickness equivalent to a depth of its corresponding recessed opening so that after embedding the PCB into the recess, the surface of the PCB is planar with the remaining internal surface of the side in which the PCB resides to avoid interference with the mechanical working components of the lock.

Referring to FIGS. 10E-F, the exposed surface of channel 12 may optionally have one or more openings 30 traversing there-through. These openings 30 also allow electrical circuitry outside the lock to be connected via wiring to an electrical connector that may reside on the backside of the PCB in locations corresponding to the openings 30. A ground plate may also reside on the backside of the PCB along with the one or more electrical connector(s) or as a stand alone feature.

As shown in the drawings, the PCBs may have a thickness substantially equivalent to the thickness or depth of the corresponding recessed channel into which such PCB is to be embedded. In this manner, once embedded the PCB(s) minimize, or all together avoid, modifications to and/or rearrangements of existing mechanical working components of the locking device, avoid moving parts within the locking device, and optimize the positioning of sensors, magnets and/or actuators within the locking device as discussed further below. Optionally, in locations that do not interfere with lock openings and/or working components multi-surface mount technology may be employed by mounting one or more additional circuit boards on top of the embedded PCB to provide the electrified lock with increased processing power. These additional surface mounted circuit boards extend upward from a surface of the embedded PCB into the locking device (may be parallel or perpendicular to the embedded PCB).

Either before or after the PCB is embedded inside the housing side, various electrical components may be surface mounted to the PCB in strategic locations across the board. In one or more embodiments, the working components of the mechanical lock may be provided with magnets 55 at various locations. These magnets 55 may reside on a surface of the working components, be inset into the surface of the working component, or even be imbedded inside the working component itself. The plurality of magnets 55 residing on the lock's working components provides the ability to monitor the working components at multiple locations to detect multiple positions, including opened and closed positions, of such working components, as opposed to conventional methods and approaches that only allow the monitoring and detection of opened and closed positions due to wire routing, size, and space constraints.

The PCB(s) of the invention may be provided with one or more sensors 50 at various locations across the PCB. A bypass capacitor 52 may be connected to each sensor 50 to eliminate system noise and avoid sensor oscillations. The sensors attached to the PCB include, but are not limited to, non-contact sensors, analogue transducers, hall sensors, electrical switches, reed switches, and the like. These sensors 50 are attached at positions corresponding to the magnets on the mechanical working components of the lock for sensing the positions of these various mechanical lock components. As the working component with its magnet moves or rotates, the magnet is brought into or out of close proximity with a sensor mounted on the PCB, thereby enabling monitoring of the door and/or lock movement to detect opening and closing of the door, tampering with and/or vandalism to the lock or door, actuation of levers or bolts, and the like.

In some embodiments, one or more sensor(s) 51 may be raised away from the surface of the PCB, such that, the raised sensor extends toward the other side of the housing for sensing magnets residing at or near this other side of the housing. As an alternative, an embedded PCB may reside in this other side of the housing and have one or more surface mounted sensors for detecting a magnet near this side, whereby the embedded PCBs on opposing sides may be connected to one another via electrical wiring.

Other electrical components that may be mounted to the PCBs of the invention include sensors 54 that do not require a magnet for triggering. These sensors may include, but are not limited to, mechanical micro-switches, a Magnasphere sensor, push buttons, optical sensors, and the like. An actuator 61 may also be attached to the housing side in which the embedded PCB resides to drive the lock components to lock and/or unlock the lock. The actuator 61 is attached to the housing side in a location that is in close proximity to the PCB so that the actuator 61 is electrically powered by the PCB via wiring and a connector. As an alternative, the actuator may be directly assembled to the PCB. Actuators suitable for use in the various embodiments of the invention include, but are not limited to, solenoids, motors, brush DC motors, stepper motors, piezo motors, shape memory actuators, and the like. If increased electrical current is required, such as with the use of a solenoid actuator, traces may be routed through a middle PCB layer or the board may be conformally coated with an insulation layer to protect external circuits and components.

The PCBs may also be provided with one or more surface mount connectors 70 having inputs for electrical connection to the actuator 61. Other electrical components surface mounted onto the surface of the PCB that resides inside the lock include, but are not limited to, an accelerometer, temperature sensors, heating components, and the like. An accelerometer enables the measuring or impact on the door to detect if the door is being closed, if the door is being impacted or hit (e.g., someone vandalizing the door), and the like. Temperature sensors enable the measuring of the temperature inside the lock. A heating component provides heat inside the lock to control the internal lock temperature to prevent freezing and maintaining the workability of the internal mechanical lock components.

Figure 11B:
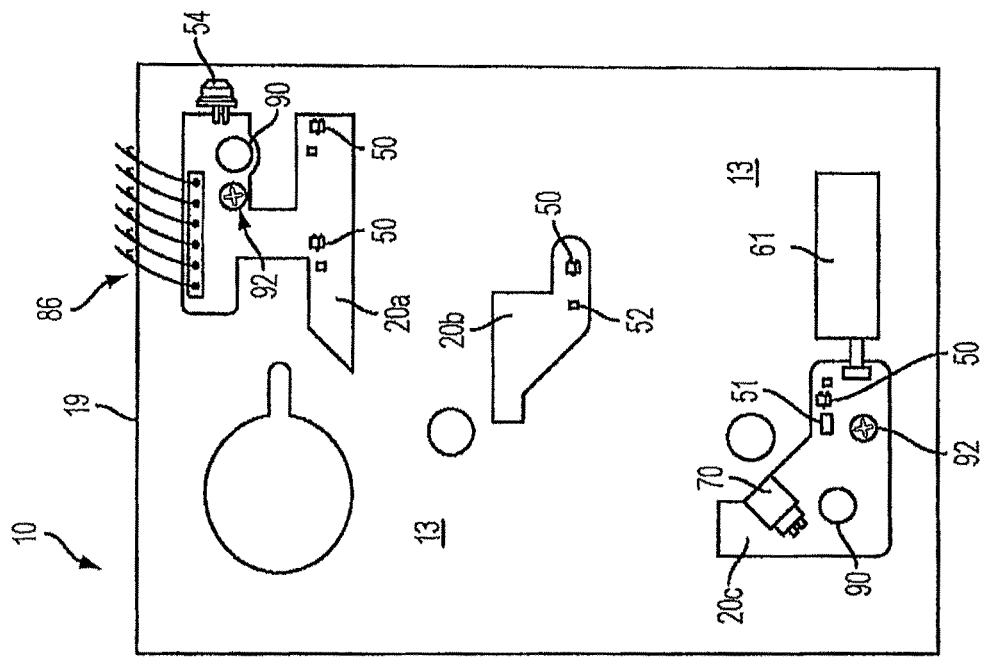
FIGS. 11A-B are a side elevational view and a top plane view, respectively, showing that multiple PCBs having surface mount technology may be embedded within one or more sidewalls inside a locking device housing in accordance with one or more embodiments of the invention.
Figure 11A:
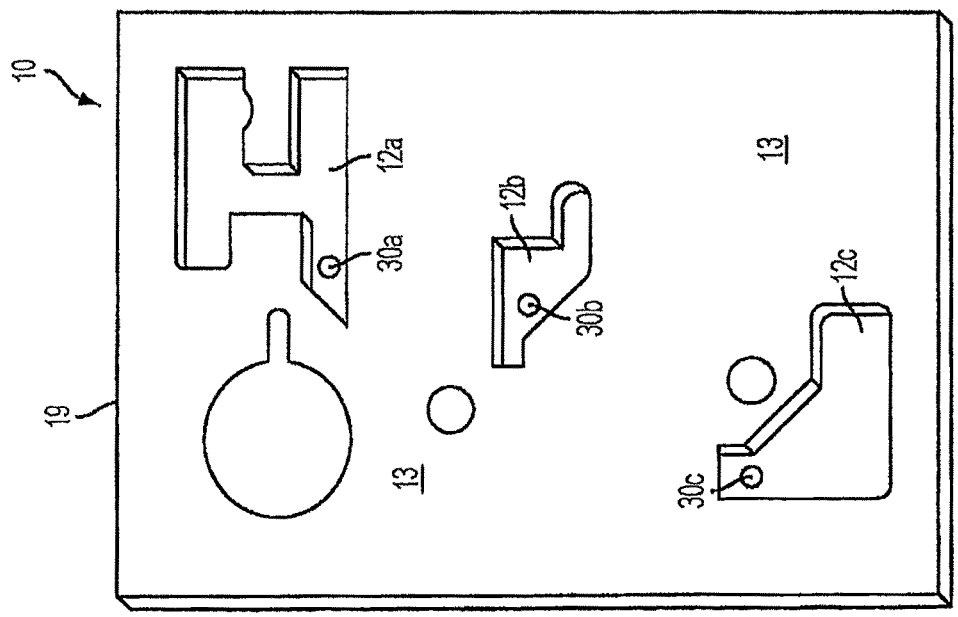

A signal output device 81 may be connected to the PCB. This signal output device may be a controller board as shown in FIGS. 10B and 10D, or it may be a wire harness as shown in FIG. 11B. The signal output device 81 is an electronic module on the PCB that intakes the electrical signal outputs from the various electronic components residing on or in electrical communication with the PCB 20 and converts these inputs into a readable, digital output signal. For instance, a WIFI or communications module (e.g., Ethernet, bluetooth, and the like) may be assembled into the device 81 mounted on the PCB to link the PCB to a centralized lock control system. As such, this WIFI or communications module is embedded inside the lock.

At various locations across the PCBs, selected ones or each of the PCBs may be provided with a number of openings 90 in the PCB. These openings 90 may reside in locations on the PCB corresponding to locations of working components of the lock, in locations corresponding to positions where external devices may be inserted into the lock, in locations corresponding to where screw 92 may be inserted to secure the housing side to the rest of the lock housing, and the like.

Whether one or more PCBs are embedded inside a lock device housing, the invention enables the utilization of the embedded PCB(s) for all electronic functions within a locking mechanism to increase performance capabilities including, but not limited to, precise sensing, actuation, circuit routing, efficient electrical connectivity, signal conditioning (e.g., AC rectification), communications (e.g., WiFi, bluetooth, etc.), logic control, micro-processing which can condition the signals for input or output, signaling (e.g., LED, status indicators, etc.), and standardized connectorization to external circuits. The embedded PCBs of the invention may also be equipped with wireless or cellular circuits that may connect to an external antenna.

Again, the shape, size and length of each PCB of the invention, or combinations of PCBs, allow electrical wiring to be provided from one end of the lock to another end of the lock (e.g., from the bottom to the top of the lock). In one or more embodiments, the PCB(s) is provided over a diagonal distance across the lock from top to bottom, and vice versa, whereby multiple sensors are strategically positioned on the PCB to sense the magnets residing in or on the mechanical working components to detect the movement thereof. As such, the PCBs provide all of the wiring within the lock housing and simultaneously provide the positioning for the various sensors within the lock that are used to detect motion of the mechanical lock components. This allows the circuitry to determine when the lock is open, when the dead bolt 41 has been operated, when the dead bolt 41 is in motion, and the like.

By embedding PCBs within an internal surface of a locking device housing 10, the various embodiments of the invention are suitable for use with those locking devices having constrained real estate. The invention converts a locking device having constrained real estate from a strictly mechanical locking device into an electrified lock having capabilities for digital monitoring and electronic actuation directly inside the locking device itself. These locking devices with constrained real estate may include existing locking devices having more compact designs, existing mechanical locking devices having increased and/or improved technological advances residing inside the locking that consume an increased or substantial portion of the valuable real estate within the lock, and even future lock designs configured with constrained real estate.

Figure 12C:
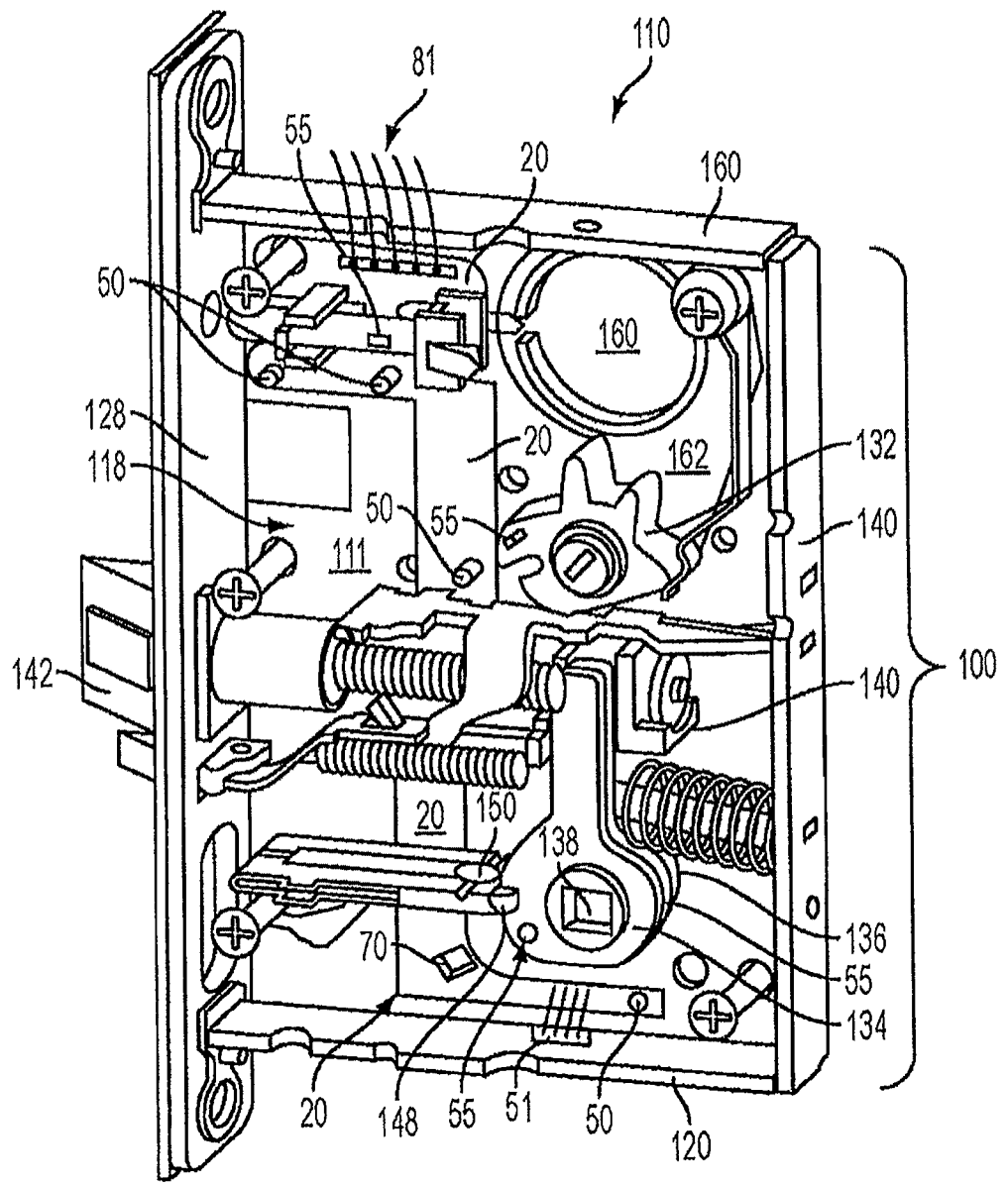

While not meant to limit the invention, one or more embodiments of the invention are suitable for use with locking device housings 10 that encase the mechanical lock device components. For instance, one such suitable lock encasing is a mortise lock housing 110 as shown in FIGS. 12A-C. A mortise lock housing 110 includes a lateral side 119 being a cover plate and a casing portion. The casing portion of the mortise lock housing includes top 160 and bottom 170 walls, a back wall 140 and a lateral sidewall 118 that opposes the cover plate lateral side 119 when the housing is assembled. A front plate 128 resides opposite the back wall 140 and between sides 118, 119. Again, in one or more embodiments, an interior surface 111 of the first lateral sidewall 118 alone, an interior surface 113 of the cover plate 119 alone, or interior surfaces 111, 113 of both the sidewall 118 and the cover plate 119 of the mortise housing 110 may be provided with one or more embedded PCBs 120 in accordance with the invention.

Referring to FIG. 12C, a single embedded PCB 20 assembly of the invention is shown whereby the PCB 20 is configured with a shape, size and thickness that does not interfere with the positioning of the lock's working components residing inside the housing 110 and allows the PCB to pass around the various openings in the mortise lock. These working components residing inside the mortise lock include components connected to handle actuators to throw the dead bolt 41 and the various pivots supported by the cover plate for components that move within the mortise lock. For instance, the working components may include, but are not limited to, a control hub 132, spindle hubs 134, 136, spindle openings 138, a latch bolt 142 having a latch bolt tail 140, a shaft 150 turned by a rotatable element 148, a latch retract lever 162, a lock cylinder opening that may rotate the control hub 132 and the like.

In the various embodiments of the invention, one or more, or even all, of these working components of the mortise lock may be provided with one or more magnets 55 on or inserted into a surface thereof. With the PCB 20 configured to avoid the openings in the mortise lock and these working components, while still residing in close proximity thereto, the sensors 50 are strategically positioned on a surface of the PCB so that the sensors 50 are in close proximity to the various magnets 55 for detecting and monitoring motion of these working components of the lock.

Some of the sensors 50 may reside on the PCB while other sensors 51 may be connected with leads to allow the sensor 51 to stand up and away from the surface of the PCB. In this manner, the sensor 51 is projected into the lock mechanism toward the opposing sidewall to detect magnets 55 residing on locking components that reside adjacent or near this opposing sidewall. For instance, referring to FIG. 12C, the two spindle hubs 134, 136 each have a corresponding oval comprising a magnet 55. The spindle hub 136 closest to the PCB has a corresponding sensor 50 mounted directly on the surface of the PCB, while the spindle hub 134 located farthest from the PCB is sensed by a sensor 51 that is raised off the surface of the PCB and resides within the mechanical lock.

Once the interior surface of the lateral sidewall 118, the cover plate 119, or both the lateral sidewall 118 and the cover plate 119, have been provided with one or more embedded PCB(s) in accordance with the invention, the now electrified mortise lock is secured within a mortise recess 260 residing between front 214 and back 212 surfaces of a door 200. Accordingly, the various embodiments of the invention provide for the easy and efficient conversion of a conventional mortise lock into an electrified mortise lock having electronic capabilities, particularly, digital monitoring and electronic actuation inside the locking device itself. In one or more embodiments, the electrified mortise lock of the invention includes one or more PCB s configured to carry wiring from one portion of the mortise lock to another portion of the lock for the electrical connection of a variety of components residing on the PCB to provide the lock with hall effect and/or reed sensing, solenoid actuation for electrified locking and/or unlocking the mortise lock, minimal mechanical modifications, embedded magnets, on-board processing and/or communications linked to a centralized lock control system, and the like.

It should be appreciated that the housing side containing the embedded PCB may be configured as a universal lock housing side (e.g., a universal lock housing cover plate) for installation in existing lock devices having no electronic components. In this manner, a conventional non-electric lock having reduced cost, high volume, lock components may be converted into an electrified lock that has electrical monitoring and actuation capabilities.

It should be appreciated that in one or more embodiments of the invention the PCB(s) may be secured directly inside other types of housed locks including, for example, a cylindrical lock. In this aspect, an internal surface within the cylindrical lock (e.g., the cylindrical outside of the lock) may be provided with a recessed/routed out depression for accommodating an embedded PCB. Alternatively, an internal surface of the cylindrical lock may be provided with a mount for securing the PCB inside the lock. In either aspect, both the channel and the PCB are configured to avoid any openings and/or working components within the lock. The PCB is secured inside the channel so that the conventional cylindrical lock is converted from a non-electrified lock to an electrified cylindrical lock. For instance, the electrified cylindrical lock may include slotted mounts, reed sensing, an on-board bridge rectified solenoid circuit, a motor circuit, an integrated earth ground, a common wire harness connection and the like.

The PCBs may be used in a variety of electronically actuated access-control devices 100 including, but not limited to, exit devices, electronic door strikes, door closers, door operators, cylindrical locks, tubular locks, auxiliary locks, deadbolts, and the like. For instance, one or more PCB may be embedded or provided within the rail of an exit device, embedded within a plate of the door strike or closer, and the like. Additionally, the PCBs may be used in a variety of electronically actuated access-control devices 100 that employ the use of various access user recognition systems including, but not limited to, a key, a password, a card (e.g., the lock would include a slot for insertion of a card directly into a reader within the lock), magnetic components, a keypad, a fingerprint recognition device, an RF card reader, a remote controller recognition system, and the like.

While still not deviating from the novel concepts of the invention of having one or more PCBs residing inside a locking device itself, rather than embedding the board inside a side of the locking device housing, mounts or harnesses may be secured to an internal surface of the locking device housing. These mounts or harnesses may reside in locations that will not interfere either with the various lock openings or with the working components of the lock. The PCBs may then be embedded within the mount(s) or harness(es) residing on an interior surface of the housing so that the PCBs reside inside the locking device housing itself. Optionally, one or more of the working components inside the lock may be mechanically machined to remove a portion of the working component thickness so as to prevent and/or avoid contact with the PCB mounted onto the internal surface of such housing side.

Referring to the actuator assembly shown in FIG. 4, the solenoid operation emulates using an energy efficient motor 74. The associated circuitry is operable with both 12 volts and 24 volts and may be switch selectable to emulate either "fail safe" (default unlocked) or "fail secure" (default locked). The actuator and associated circuitry may be of any type known to those of skill in the art. By selecting the appropriate actuator and control circuitry, the lock can be operated by and/or connected to any type of external control unit to provide lock control and door lock monitoring. Although any type of actuator and circuitry may be used, additional information about the solenoid emulator shown in FIG. 4 can be found in U.S. Provisional Patent Application Ser. No. 61/683,455 filed on Aug. 15, 2012, the disclosure of which is incorporated herein by reference.

Those of skill in this art will note that the cost of manufacturing the different configurations for the electrical connector key is relatively low as compared to the cost of constructing the lock mechanism and its sensors. It is desirable to be able to sell a low-end lock mechanism with few sensors at a lower price than a higher end lock mechanism having many more sensors. As such, it may be desirable for the manufacturer to ensure that any electrical connector key inserted into the lock is an authorized electrical connector key in order to prevent low end devices from being ordered at a low price and upgraded at low expense with an unauthorized electrical connector key that has been reconfigured to activate all sensors installed in the lock mechanism. As previously noted, this can be achieved by placing circuitry in the electrical connector key, such as an identification chip that provides encrypted communication with a microprocessor or other digital component in the lock to identify to the lock or to the external control unit that an authorized electrical connector key has been installed.

For example, a simple 3-pin device such as an Atmel AT88SA10HS-TSU-T needing only power ground and a serial data connection can be installed on the key circuit board 218 to provide digital confirmation to the lock that the installed electrical connector key is authorized. Other simpler methods of providing such confirmation of an authorized electrical connector key are also known to the art.

When complex digital encryption and handshaking techniques are used, they may require a short time period during which calculations are made to provide the necessary digital confirmation of authorized status. If the electrical connector key fails to pass authorization testing, the circuitry in the lock mechanism will refuse to operate the actuator installed and or refuse to pass sensor signals—depending on the selected design for the lock circuitry. A delay before actuation of the lock, however, is undesirable. Accordingly, in an exemplary design, an authorization bit is stored by the lock mechanism control circuitry within the lock and authorization testing is completed by the lock mechanism control circuitry after the lock completes an actuation cycle, not before.

The authorization bit is initially set to "authorized" status. The lock mechanism control circuitry checks the authorization bit before driving the actuator to operate the lock. This allows one or more initial cycles of the lock to be performed successfully, regardless of the true authorized status of the electrical connector key and provides the advantage of avoiding any delay for authorization testing. When the lock has a suitable time period to complete the authorization testing, the authorization bit is then set to "unauthorized" status and subsequent operation of the lock is prevented.

It will be understood that the electrical connector key may be adapted to provide many different types of configured interconnections between selected components within the electronic door lock and the external control unit. One such configured interconnection is a simple "connected" or "not connected" configuration. The external control unit may simply not be able to receive sensor signals (or not send signals to selected lock components.) Another configuration may involve rerouting signals from the lock back to the lock for subsequent processing. One lock mechanism may be send "raw" sensor signals to the external control unit. Another lock mechanism may have sophisticated electrical processing capabilities and may use the same "raw" sensor signal internally, in combination with other sensor signals to provide a processed output signal to the external control unit.

Further, the electrical connector key may incorporate additional electronic components to provide additional functions to the lock. A WiFi transmitter/receiver and antenna may be added. Alternatively, the electrical connector key may be provided with a numbered ID chip allowing the lock to be identified by the external control unit it is connected to. Many other interconnection schemes and additional functions for the electrical connector key will be apparent to those of skill in this art.

Another aspect of the invention resides in a system comprising multiple differently configured electrical connector keys of the type described above in combination with one or more different lock mechanisms capable of receiving a selected one of the differently configured electrical connector keys. Each different lock mechanism has a different selection of electrical components therein. The selected one of the differently configured electrical connector keys is paired with a selected one of the one or more different lock mechanisms. The selected connector key and the selected one of the door lock mechanisms define a complete electronic lock ready for connection to the external control unit and provides a specific selected interconnection between selected electrical components available in the selected one of the door lock mechanisms and circuitry in the external control unit.

It will also be understood that another aspect of the invention is the method of providing an electronic door lock having desired functionality in which multiple differently configured electrical connector keys of the type described above are provided and one or more different door lock mechanisms capable of receiving the electrical connector keys are provided. One of the provided one or more different door lock mechanisms is selected and one of the differently configured electrical connector keys is also selected. The combination of the selected electrical connector key and the selected door lock mechanisms provides the desired functions for the complete electronic door lock when the electrical connector key is inserted into the selected electronic door lock and connected to the external control unit.

Therefore, the present invention achieves one or more of the objects described above. The configurable electrical connector key for connecting an electronic door lock to an external control unit, such as a lock monitoring or control system, includes a connector key housing shaped to engage the electronic door lock and a configurable circuit mounted within the connector key housing that makes a configured interconnection between selected components within the door lock and the external control unit. The combination of an electrical connector key and an electronic door lock and a system and method includes multiple differently configured electrical connector keys and one or more standardized electronic door locks to allow selected sensors and functions of the door lock to be enabled by selecting an appropriately configured electrical connector key.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An electronic lock system, comprising:
an interchangeable electrical connector selected from a plurality of differently configured interchangeable electrical connectors including a first electrical connector configured with a first preselected connection of wires and a second electrical connector configured with a second preselected connection of wires that is configured differently from the first electrical connector; and,
a lock configured to perform a predetermined plurality of functions with each function of the plurality of functions being different from one another, the lock including a predetermined plurality of sensors and actuators configured to enable the predetermined plurality of functions, the lock configured to perform one or more of the predetermined plurality of functions in response to a predetermined actuation of one or more of the sensors and actuators, the lock being connectable with each of the differently configured interchangeable electrical connectors to enable the lock to perform different functions depending on the selected one of the plurality of differently configured interchangeable electrical connectors connected to the lock, wherein the lock is connectable with the first electrical connector and configured to perform a first function when connected with the first electrical connector and wherein the lock is connectable with the second electrical connector and configured to perform a second function when connected with the second electrical connector, the first function being different from the second function.

2. The electronic lock system of claim 1, wherein the lock comprises a lock housing.

3. The electronic lock system of claim 2, wherein the predetermined plurality of actuators are disposed within the lock housing.

4. The electronic lock system of claim 3, wherein the predetermined plurality of sensors are disposed within the lock housing and wherein the predetermined plurality of actuators are configured to activate in response to signals from the predetermined plurality of sensors.

5. The electronic lock system of claim 2, wherein the lock comprises a locking mechanism disposed within the lock housing, the locking mechanism being moveable between latched and unlatched positions.

6. The electronic lock system of claim 5, wherein the predetermined plurality of sensors sense one or more parameters selected from the group of a parameter indicating that the locking mechanism is in the latched position, a parameter indicating that the locking mechanism is in the unlatched position, a parameter indicating that the interchangeable electrical connector is connected to the lock, a parameter indicating that the interchangeable electrical connector is disconnected from the lock, a parameter indicating that a handle is rotated, and a parameter indicating that a cover is removed.

7. The electronic lock system of claim 2, further comprising a circuit board, wherein the circuit board is disposed inside the lock housing.

8. The electronic lock system of claim 1, further comprising an external control unit, wherein the external control unit is configured to control operation of the lock.

9. The electronic lock system of claim 8, wherein the external control unit comprises an alarm and is configured to monitor signals from the predetermined plurality of sensors, wherein the external control unit activates the alarm upon detecting a predetermined subset of the signals.

10. The electronic lock system of claim 8, wherein the external control unit comprises an authentication input device configured to recognize a user input, wherein the authentication input device is selected from the group of a card key reader, a proximity detector, a keypad, a fingerprint sensor, an iris scanner, and a voice recognition sensor.

11. A method of upgrading a lock, comprising:
selecting an interchangeable electrical connector from a plurality of differently configured interchangeable electrical connectors including a first electrical connector configured with a first preselected connection of wires and a second electrical connector configured with a second preselected connection of wires that is configured differently from the first electrical connector;
providing a lock configured to perform a predetermined plurality of functions with each function of the plurality of functions being different from one another, the lock including a predetermined plurality of sensors and actuators configured to enable the predetermined plurality of functions, the lock configured to perform one or more of the predetermined plurality of functions in response to a predetermined actuation of one or more of the sensors and actuators, the lock being connectable with each of the differently configured interchangeable electrical connectors to enable the lock to perform different functions depending on the selected one of the plurality of differently configured interchangeable electrical connectors connected to the lock; and,
connecting the lock with the first electrical connector to enable the lock to perform a first function, alternatively connecting the lock with the second electrical connector to enable the lock to perform a second function that is different from the first function.

12. The method of claim 11, further comprising:
connecting the lock with the first electrical connector to enable the lock to perform the first function;
disconnecting the lock from the first electrical connector;
connecting the lock with the second electrical connector to enable the lock to perform the second function that is different from the first function.

* * * * *